(12) United States Patent
Hey et al.

(10) Patent No.: US 6,551,484 B2
(45) Date of Patent: Apr. 22, 2003

(54) REVERSE VOLTAGE BIAS FOR ELECTRO-CHEMICAL PLATING SYSTEM AND METHOD

(75) Inventors: H. Peter W. Hey, Sunnyvale, CA (US); Yezdi N. Dordi, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 117 days.

(21) Appl. No.: 09/766,060

(22) Filed: Jan. 18, 2001

(65) Prior Publication Data

US 2003/0034250 A1 Feb. 20, 2003

Related U.S. Application Data

(63) Continuation-in-part of application No. 09/289,074, filed on Apr. 8, 1999, now Pat. No. 6,258,220.

(51) Int. Cl.[7] .......................... C25D 5/00; C25D 17/00; C25B 15/00
(52) U.S. Cl. .................... 205/96; 205/137; 204/212; 204/230.2
(58) Field of Search ................. 205/96–97, 118, 205/137, 80; 204/230.2

(56) References Cited

U.S. PATENT DOCUMENTS

| 2,742,413 A | 4/1956 | Cransberg et al. | 204/52 |
|---|---|---|---|
| 2,882,209 A | 4/1959 | Brown et al. | 204/52 |
| 3,649,509 A | 3/1972 | Morawetz et al. | 204/238 |
| 3,727,620 A | 4/1973 | Orr | 134/95 |
| 3,770,598 A | 11/1973 | Creutz | 204/52 R |
| 4,027,686 A | 6/1977 | Shortes et al. | 134/95 |
| 4,092,176 A | 5/1978 | Kozai et al. | 134/186 |
| 4,110,176 A | 8/1978 | Creutz | 204/52 R |
| 4,113,492 A | 9/1978 | Sato et al. | 96/67 |
| 4,315,059 A | 2/1982 | Raistrick et al. | 429/112 |
| 4,326,940 A | 4/1982 | Eckles et al. | 204/232 |
| 4,336,114 A | 6/1982 | Mayer et al. | 204/52 R |
| 4,376,685 A | 3/1983 | Watson | 204/52 R |
| 4,405,416 A | 9/1983 | Raistrick et al. | 204/68 |
| 4,428,815 A | 1/1984 | Powell et al. | 204/297 |
| 4,435,266 A | 3/1984 | Johnston | 204/276 |

(List continued on next page.)

FOREIGN PATENT DOCUMENTS

| DE | 932 709 | 3/1955 | |
|---|---|---|---|
| JP | 58182823 | 10/1983 | ......... H01L/21/288 |
| JP | 63118093 | 5/1988 | ............ C25D/5/18 |
| JP | 04131395 | 5/1992 | ............ C25D/5/34 |
| JP | 04280993 | 10/1992 | ............ C25D/5/18 |
| JP | 06017291 | 1/1994 | ............ C25D/7/12 |
| SU | 443 108 | 12/1974 | ............ C23B/5/20 |
| WO | 97/12079 | 4/1997 | ............ C25D/5/02 |
| WO | 99/25902 | 5/1999 | ............ C25B/13/00 |
| WO | 99/25903 | 5/1999 | ............ C25D/5/00 |
| WO | 99/25904 | 5/1999 | ............ C25D/5/02 |
| WO | 99/25905 | 5/1999 | ............ C25D/5/02 |
| WO | 99/26275 | 5/1999 | |

OTHER PUBLICATIONS

Australian Patent Office Written Opinion from SG 9906158–2, Dated Mar. 5, 2002.

(List continued on next page.)

*Primary Examiner*—Donald R. Valentine
(74) *Attorney, Agent, or Firm*—Moser, Patterson & Sheridan

(57) ABSTRACT

A method of immersing a substrate into electrolyte solution for electroplating, the method comprising connecting an electric source between an anode immersed in the electrolyte solution and a seed layer formed on the substrate. A first voltage level of the seed layer is biased to be equal to, or more positive than, a second voltage level of the anode. The substrate is then immersed into the electrolyte solution.

30 Claims, 26 Drawing Sheets

U.S. PATENT DOCUMENTS

| | | | |
|---|---|---|---|
| 4,489,740 A | 12/1984 | Rattan et al. | 134/140 |
| 4,510,176 A | 4/1985 | Cuthbert et al. | 427/82 |
| 4,518,678 A | 5/1985 | Allen | 430/311 |
| 4,519,846 A | 5/1985 | Aigo | 134/15 |
| 4,693,805 A | 9/1987 | Quazi | 204/192.22 |
| 4,732,785 A | 3/1988 | Brewer | 427/240 |
| 4,789,445 A | 12/1988 | Goffman et al. | 204/114 |
| 5,039,381 A | 8/1991 | Mullarkey | 204/47.5 |
| 5,055,425 A | 10/1991 | Leibovitz et al. | 437/195 |
| 5,092,975 A | 3/1992 | Yamamura et al. | 204/198 |
| 5,155,336 A | 10/1992 | Gronet et al. | 219/411 |
| 5,162,260 A | 11/1992 | Leibovitz et al. | 437/195 |
| 5,222,310 A | 6/1993 | Thompson et al. | 34/202 |
| 5,224,504 A | 7/1993 | Thompson et al. | 134/155 |
| 5,230,743 A | 7/1993 | Thompson et al. | 134/32 |
| 5,252,807 A | 10/1993 | Chizinsky | 219/390 |
| 5,256,274 A | 10/1993 | Poris | 205/123 |
| 5,259,407 A | 11/1993 | Tuchida et al. | 134/151 |
| 5,290,361 A | 3/1994 | Hayashida et al. | 134/2 |
| 5,316,974 A | 5/1994 | Crank | 437/190 |
| 5,328,589 A | 7/1994 | Martin | 205/290 |
| 5,349,978 A | 9/1994 | Sago et al. | 134/153 |
| 5,368,711 A | 11/1994 | Poris | 204/193 |
| 5,377,708 A | 1/1995 | Bergman et al. | 134/105 |
| 5,415,890 A | 5/1995 | Kloiber et al. | 427/242 |
| 5,429,733 A | 7/1995 | Ishida | 204/224 R |
| 5,447,615 A | 9/1995 | Ishida | 204/224 R |
| 5,454,930 A | 10/1995 | Miura et al. | 205/159 |
| 5,516,412 A | 5/1996 | Andrlcacos et al. | 204/224 R |
| 5,528,118 A | 6/1996 | Lee | 318/568.17 |
| 5,608,943 A | 3/1997 | Konishi et al. | 15/302 |
| 5,625,170 A | 4/1997 | Poris | 177/50 |
| 5,651,865 A | 7/1997 | Sellers | 204/192.13 |
| 5,705,223 A | 1/1998 | Bunkofske | 427/240 |
| 5,718,813 A | 2/1998 | Drummond et al. | 204/192.12 |
| 5,723,028 A | 3/1998 | Poris | 204/231 |
| 5,730,890 A | 3/1998 | Bickford et al. | 216/87 |
| 5,838,121 A | 11/1998 | Fairbairn et al. | 318/45 |
| 6,024,856 A | 2/2000 | Haydu et al. | 205/84 |
| 6,071,388 A | 6/2000 | Uzoh | 204/297 R |
| 6,093,291 A | 7/2000 | Izumi et al. | 204/224 R |
| 6,113,771 A | 9/2000 | Landau et al. | 205/123 |
| 6,174,425 B1 * | 1/2001 | Simpson et al. | 205/96 |
| 6,179,983 B1 * | 1/2001 | Reid et al. | 205/96 |

OTHER PUBLICATIONS

Graham, Kenneth A., *Electroplating Engineering Handbook*, $2^{nd}$ Edition. (Copy not available to Applicant at this time) (No Date).

"Wafer Back Surface Film Removal", Colombo, L., Central R&D, SGS–Thomson Microelectronics, Agrate, Italy, 6 pages. No date.

"Metallization & Interconnect", Semitool Products/Sales, Oct. 27, 1998, 4 pages.

Laurell Technologies Corporation, Oct. 27, 1998, 6 pages.

"VERTEQ" VERTEQ Online, 5 pages. (No Date).

"Tantalum, Copper and Damascene: The Future of Interconnects", Singer, P., Semiconductor International, Jun. 1998, 6 pages.

"Wafer Processing", Singer, P., Semiconductor International, Jun. 1998, p. 70.

"Ney Contact Manual", Pitney, K., Electrical Contacts for Low Energy Uses, Oct. 8, 1974, 19 pages.

"Electric Contacts Theory and Application", Holm, R., Springer–Verlag New York Inc, 1967, 27 pages. (No Month).

\* cited by examiner

REVERSE VOLTAGE BIAS FOR ELECTRO-CHEMICAL PLATING SYSTEM AND METHOD

BACKGROUND OF THE INVENTION

1. Continuation Information

This is a continuation-in-part of U.S. patent application Ser. No. 09/289,074, filed Apr. 8, 1999, now U.S. Pat. No. 6,258,220, and entitled "ELECTRO-CHEMICAL DEPOSITION SYSTEM".

2. Field of the Invention

The present invention generally relates to deposition of a metal film on a substrate. More particularly, the electric current/voltage established between an anode and a substrate seed layer during metal film deposition on a substrate.

3. Background of the Related Art

Electroplating, previously limited in integrated circuit design to the fabrication of lines on circuit boards, is now used to deposit metal film on substrates to form interconnect features, such as vias or trenches. One feature filling method that utilizes electroplating requires initially depositing a diffusion barrier layer on the substrate by a process such as chemical vapor deposition (CVD), physical vapor deposition (PVD), or an electroless plating systems. A seed layer is deposited on the diffusion barrier layer by CVD, PVD, or an electroless plating systems to define a plating surface on the substrate. A metal film is then deposited on the substrate seed layer by electroplating. The deposited metal is planarized by another process such as chemical mechanical polishing (CMP), to define conductive interconnect features.

Electro-chemical plating (ECP), one embodiment of electroplating, is performed by establishing a voltage across an electrolyte solution between the anode and the substrate seed layer. Both the anode and the substrate seed layer are disposed in contact with the electrolyte solution during ECP. During normal ECP operations, a sufficient negative voltage, known as a plating voltage, is established between the seed layer on the substrate and the anode to attract metal ions in the electrolyte solution to deposit as metal film on the seed layer. The plating voltage is typically applied when the substrate seed layer is fully immersed in the electrolyte solution within the ECP system. A solid-state power supply, applied under the control of a controller, is used to apply electric voltages/currents between the anode and the seed layer. When electroplating substrates, efforts are made to ensure the production of a consistent electric current density across the seed layer on the substrate during the plating process. For each plating location on the seed layer, the metal film deposition rate varies as a function of the electric current density at that location. Therefore, variations in the electric current density across the seed layer on the substrate likely result in inconsistent plating rates and deposited metal film thickness across that seed layer.

When an ECP system is not being used to deposit metal film on a substrate for an extended period, such as during production downtime, portions of the head assembly such as the electric contacts are typically immersed in the electrolyte solution to limit oxidation of the head assembly that results from exposure of the electric contacts to air. Immersion of the head assembly into the electrolyte solution also minimizes formation of crystals that may form due to evaporation of water from the electrolyte solution containing chemicals such as copper sulfate.

Typical solid state power supplies for electroplating systems produce a slight or trickle current that flows from the anode to the electric contacts through the electrolyte solution even when the power supply is turned off. This slight or trickle current is known as a current leak, and the extent of the current leak is a quantified value in each solid state power supply. Though the trickle current level is typically small, it can cause metal ions from the electrolyte solution to deposit as metal film on the electric contacts, and thereby alter the electric characteristics of the electric contacts. Changes to the electrical or physical characteristics of the electric contacts, including oxidation, crystal formation, and deposition, adversely affect the consistency of the electric voltage/current supplied by the power supply through the electric contacts via the electrolyte solution to the substrate seed layer and adversely affects the resultant uniformity of the deposition metal film.

Therefore, there remains a need for an electro-chemical plating system that limits the current leakage from the power supply through the electric contacts and reduces the metal film deposition onto the electric contacts resulting from the current leakage.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

The terms "below", "above", "bottom", "top", "up", "down", "upper", and "lower" and other positional terms used herein are shown with respect to the embodiments in the figures and may be varied depending on the specific relative orientation of the processing apparatus.

DETAILED DESCRIPTION OF THE PREFERRED EMBODIMENT

One aspect of this disclosure relates to multiple embodiments of electro-chemical plating (ECP) systems, all of which are used to deposit a metal film on a seed layer on a substrate. Multiple embodiments of ECP systems are described in detail. A substrate holder system including a head assembly is provided that secures substrates during immersion of substrates into an electrolyte solution within the ECP system. The head assembly includes electric contacts that controllably supply electricity to the seed layer on the substrate to effect the electric biasing between the anode and the seed layer. Any level of positive voltage biasing of the seed layer relative to the anode can result in metal film deposition on the seed layer. Biasing of the electric contacts relative to the anode when the ECP system is not being used for electroplating is described. The voltage biasing of the electric contacts as described limits the depth of metal film deposition on the electric contacts. Additionally, maintaining the electric contacts immersed in the electrolyte solution during down-time limits chemical crystal formations, with such chemicals as copper sulfate, on the electric contacts. The voltage biasing can also limit metal film deposition of varying depths on the seed layer.

1. ECP System and Operation

Figure 1:
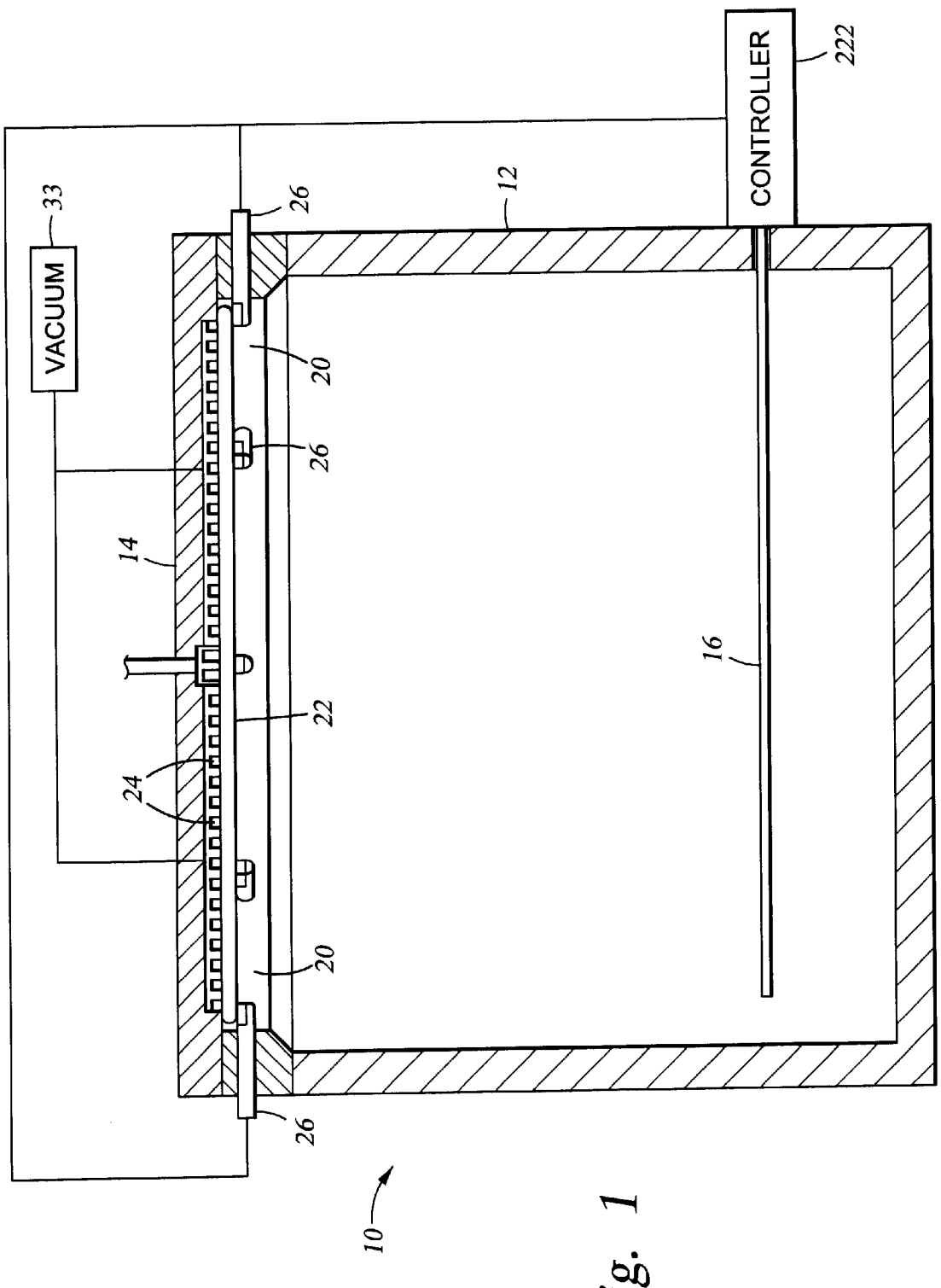
FIG. 1 is a cross sectional view of one embodiment of electro-chemical plating (ECP) system.

The structure and voltage biasing of electric contacts are maintained in a pristine condition against the effects of leakage current in an ECP system. FIG. 1 shows one embodiment of ECP system 10, such as a fountain plater, used in electroplating. The ECP system 10 includes an electrolyte cell 12, a substrate holder system 14, an anode 16, and a contact ring 20. The electrolyte cell 12 contains electrolyte solution, and the electrolyte cell has a top opening 21 circumferentially defined by the contact ring 20. The substrate holder system 14 is disposed above the electrolyte cell and is capable of displacing the substrate to be immersed into and out of the electrolyte solution. The substrate, held by the substrate holder system 14, is immersed in and removed from the electrolyte solution through the top opening of the electrolyte cell. The substrate holder system 14 is also capable of securing and positioning the substrate in a desired position within the electrolyte solution during processing. The contact ring 20 comprises a plurality of metal or metal alloy electric contacts that electrically contact the substrate seed layer. A controller 222 controls the electric voltage/current supplied by a solid-state power supply to the electric contacts. The solid-state power supply is electrically connected to the contacts and to the anode, and the controller provides an electric current to the substrate when the seed layer on the substrate is being plated. The controller 222 thereby determines the electric current/voltage established across the electrolyte solution, from the anode to the seed layer on the substrate. In periods when the seed layer is biased with a positive voltage relative to the anode, metal film can deposit on the seed layer at a rate that is a function of the voltage. A leakage or trickle current is a known current that is provided by any specific solid-state power supply when the power supply is turned off. The following embodiments of ECP system illustrate how the operation of solid-state power supplies can be operated to an ECP system in a manner to limit any metal film deposition or chemical crystal formations that form on the electric contacts as a result of the leakage current. The ECP system overcomes the leakage or trickle current produced by solid-state power supply when the power supply is turned off.

Figure 2:
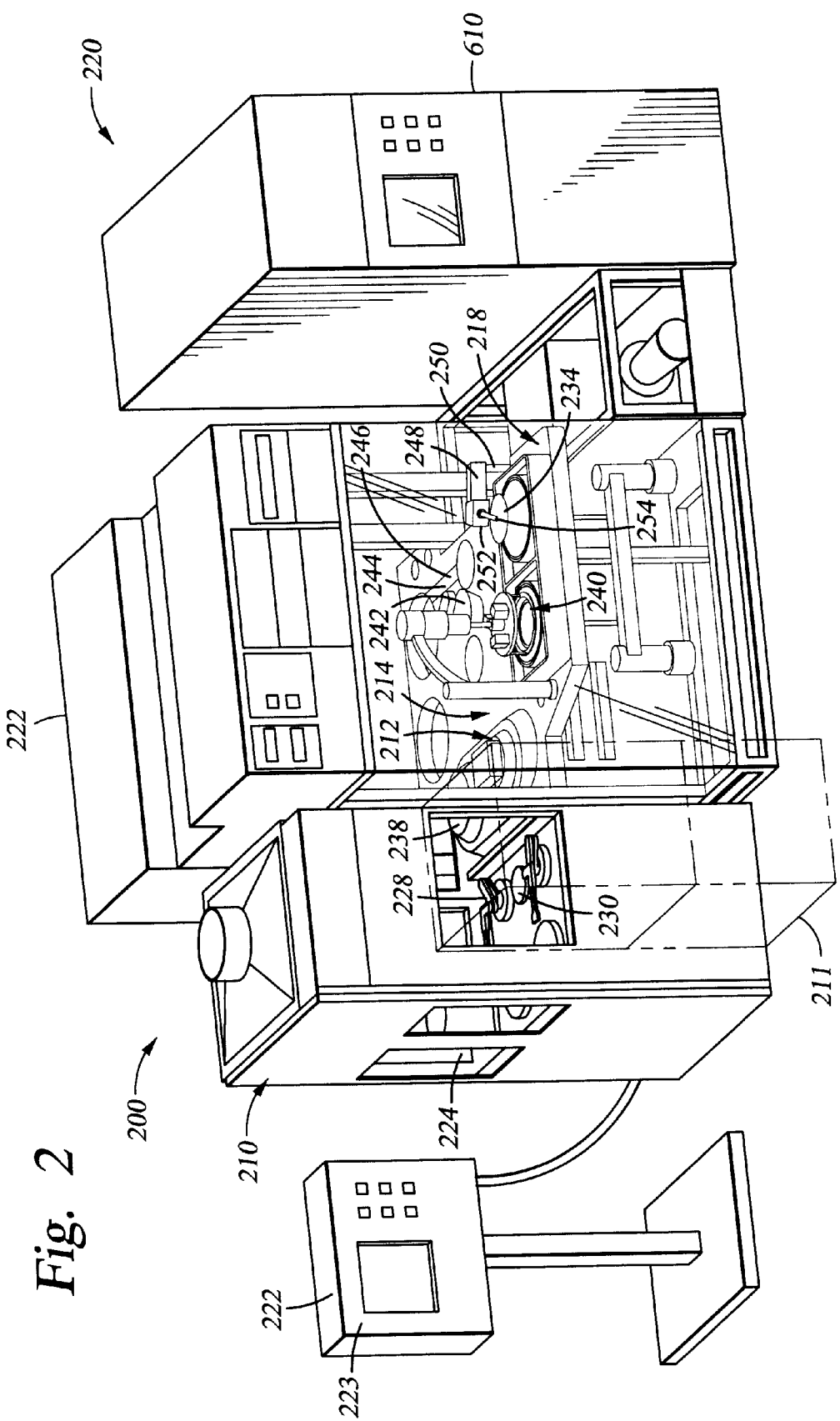
FIG. 2 is a perspective view of another embodiment of an ECP system.
Figure 3:
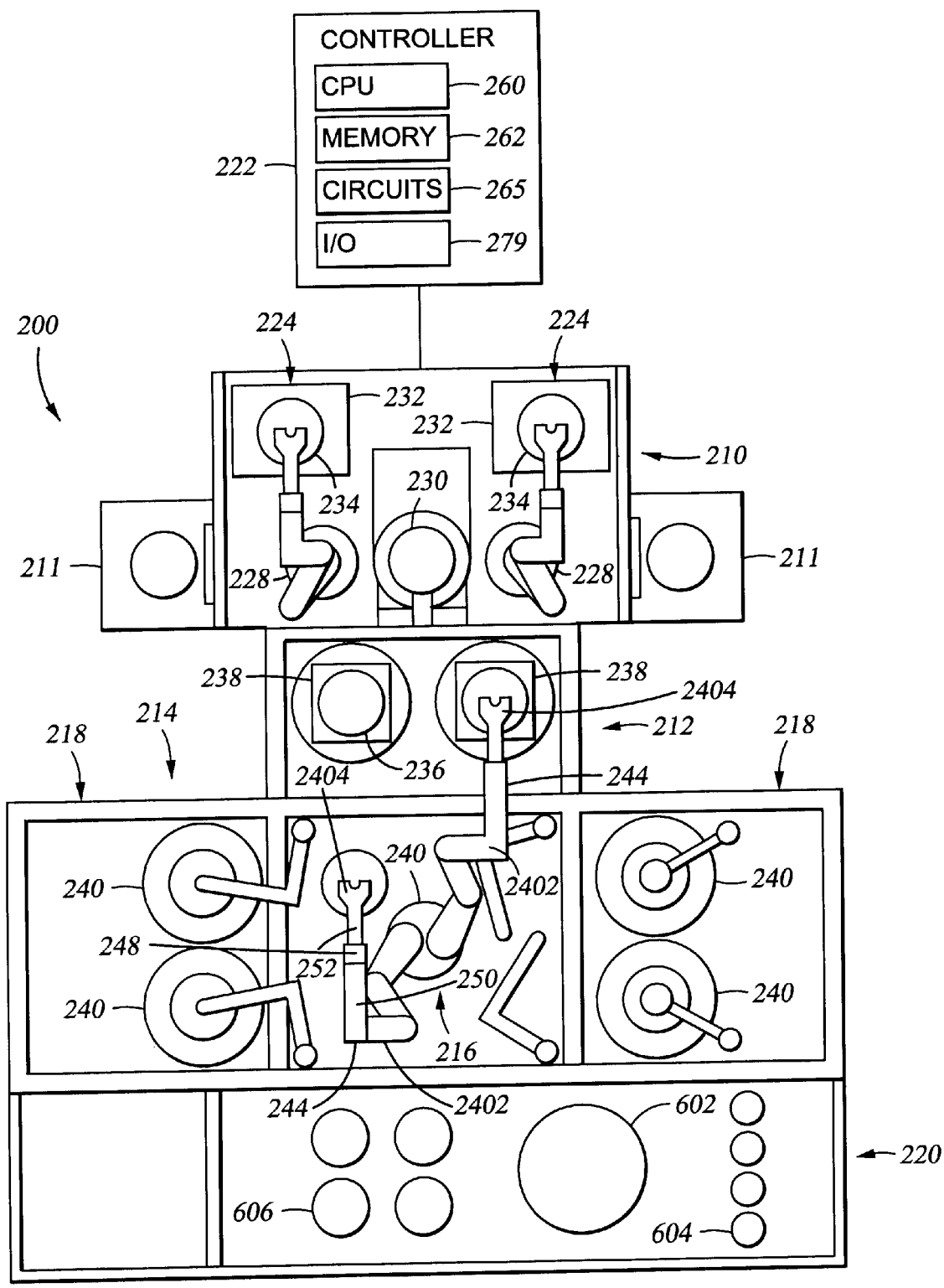
FIG. 3 is a top schematic view of the ECP system shown in FIG. 2.

FIG. 2 is a perspective view of one embodiment of ECP system 200. FIG. 3 is a top schematic view of the ECP system 200 of FIG. 2. Referring to both FIGS. 2 and 3, which should be viewed and considered together, the ECP system 200 generally comprises a loading station 210, a rapid thermal anneal (RTA) chamber 211, a spin-rinse-dry (SRD) station 212, a mainframe 214, and an electrolyte solution replenishing system 220. In one embodiment, the ECP system 200 is enclosed in a clean environment using panels such as made from PLEXIGLAS® (a registered trademark of the Rohm and Haas Company of West Philadelphia, Pa.). The mainframe 214 generally comprises a mainframe transfer station 216 and a plurality of processing stations 218. Each processing station 218 includes one or more process cells 240. An electrolyte solution replenishing system 220 is positioned adjacent the ECP system 200 and connected to the process cells 240 individually to circulate electrolyte solution used for the electroplating process.

Figure 6:
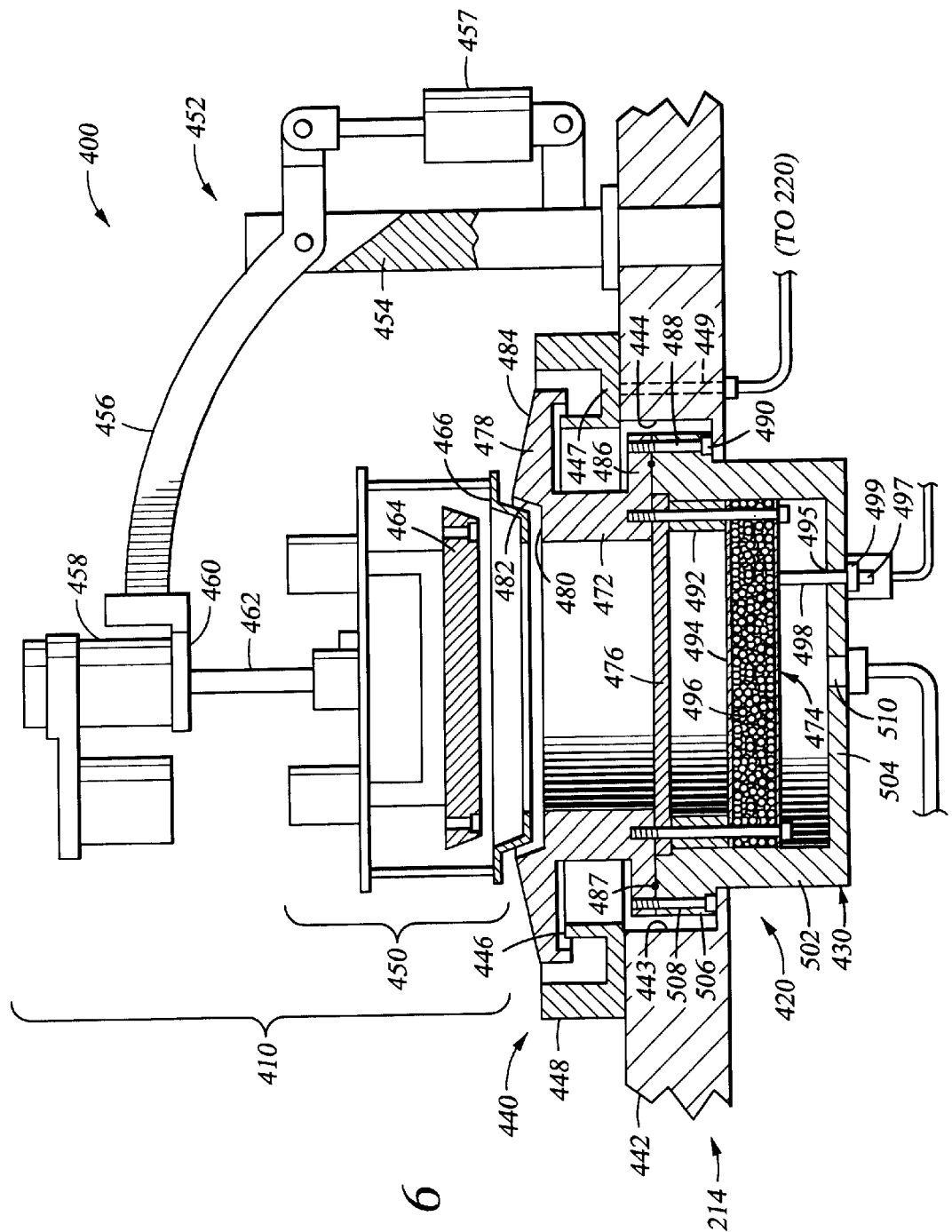
FIG. 6 is a cross sectional view of an embodiment of electroplating process cell.

The controller 222, whose components are shown in FIG. 3, comprises a central processing unit (CPU) 260, memory 262, circuit portion 265, input output interface (I/O) 279, and bus, not shown. The controller 222 may be a general-purpose computer, a microprocessor, a microcontroller, or any other known suitable type of computer or controller. The CPU 260 performs the processing and arithmetic operations for the controller 222. The controller 222 controls the processing, robotic operations, timing, and other operations associated with the ECP system 200. The controller controls the voltage applied to the anode 16, the seed layer on the substrate 22, and the operation of the substrate holder assembly 450 as shown in FIG. 6.

The memory 262 includes random access memory (RAM) and read only memory (ROM) that together store the computer programs, operands, operators, dimensional values, system processing temperatures and configurations, and other parameters that control the electroplating operation. A bus (not numbered) provides for digital information transmissions between CPU 260, circuit portion 265, memory 262, and I/O 279. The bus also connects I/O 279 to the portions of the ECP system 200 that either receive digital information from, or transmit digital information to, the controller 222.

I/O 279 provides an interface to control the transmissions of digital information between each of the components in controller 222. I/O 279 also provides an interface between the components of the controller 222 and different portions of the ECP system 200. Circuit portion 265 comprises all of the other user interface devices, such as display and keyboard.

In this disclosure, the term "substrate" is intended to describe wafers, semiconductor substrates, liquid crystal diode (LCD) displays, or other objects that can be processed within the ECP system 200. The substrates are generally circular or rectangular, may be of any size, though the circular substrates commonly have a 200 mm or 300 mm diameter, and may include notch or flat edge indentations that assist in providing and maintaining proper wafer orientation about its vertical axis. The loading station 210 may include one or more substrate cassette receiving areas 224, one or more loading station transfer robots 228 and at least one substrate orientor 230. The number of substrate cassette receiving areas, loading station transfer robots 228 and substrate orientors included in the loading station 210 can be configured according to the desired throughput of the system. As shown for one embodiment in FIGS. 2 and 3, the loading station 210 includes two substrate cassette receiving areas 224, two loading station transfer robots 228 and one substrate orientor 230. A substrate cassette 232 containing one or more substrates 234 in vertically-spaced cassette shelves provides a location where the substrates can be stored, removed from, or inserted in conjunction with the ECP system. The loading station transfer robot 228 transfers substrates 234 between the substrate cassette 232 and the substrate orientor 230. The loading station transfer robot 228 comprises a typical transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal anneal chamber 211.

Figure 4:
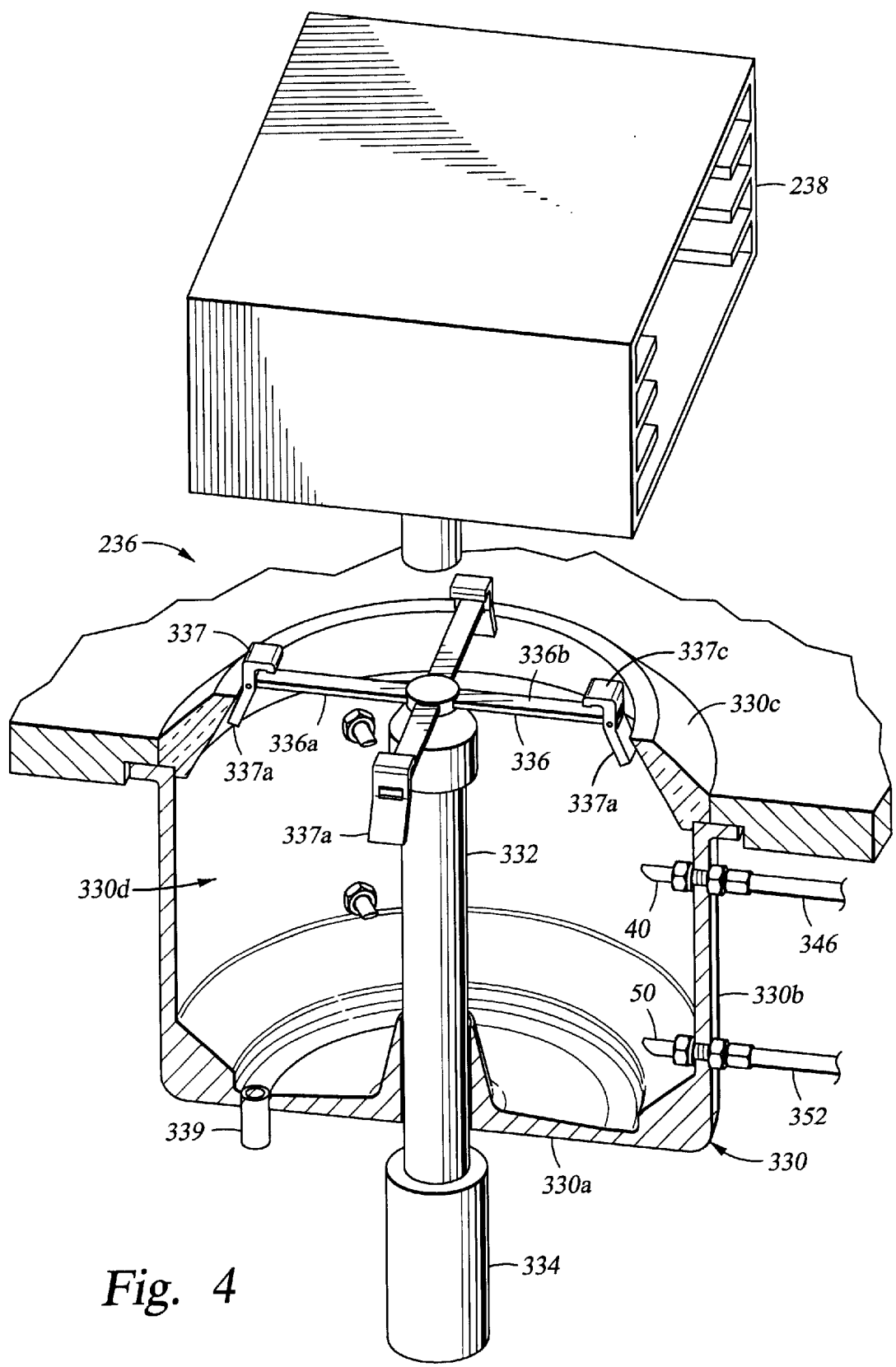
FIG. 4 is a schematic perspective view of one embodiment of spin-rinse-dry (SRD) module, incorporating rinsing and dissolving fluid inlets.
Figure 5:
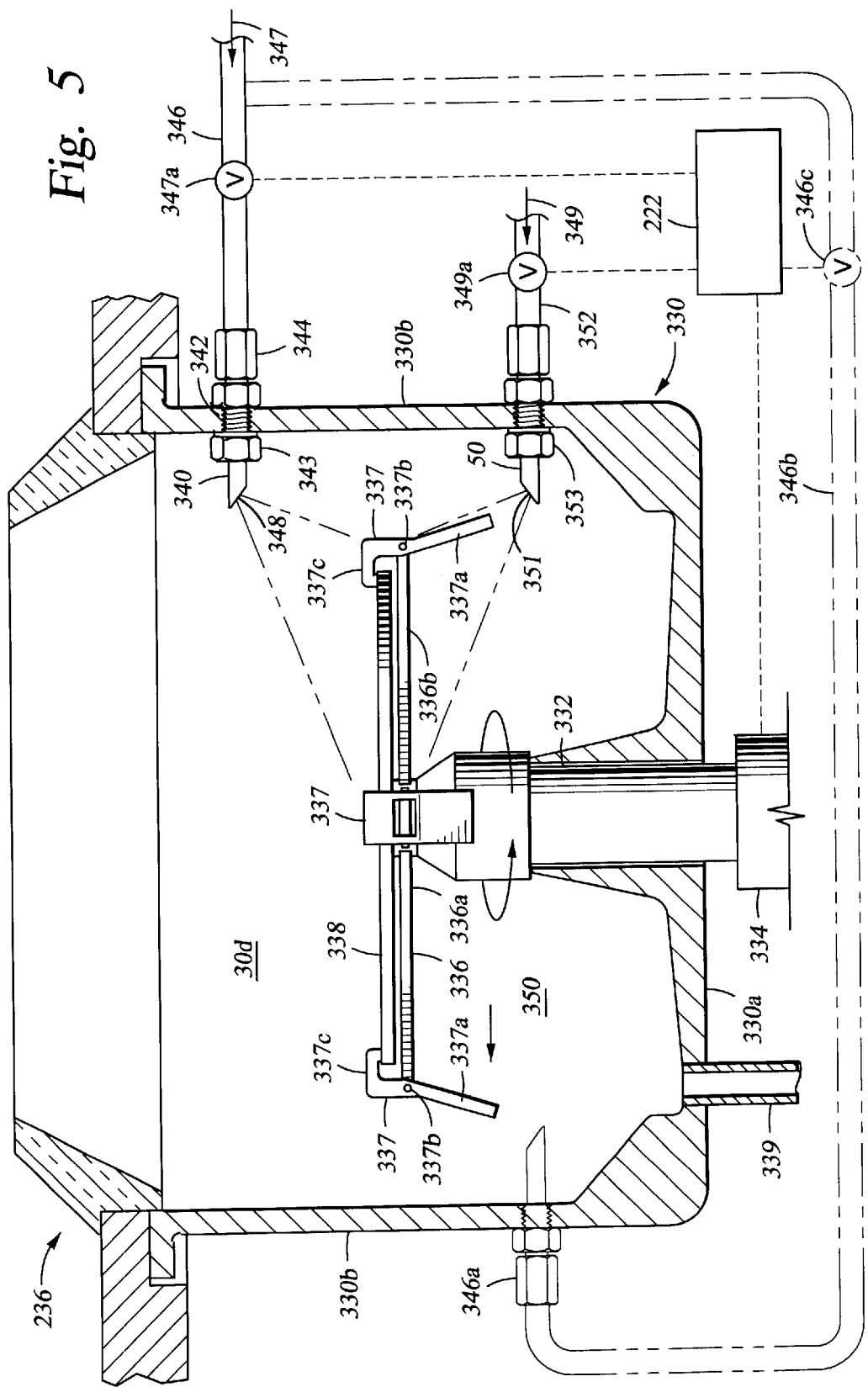
FIG. 5 is a side cross sectional view of the SRD module of FIG. 4, and shows a substrate in a processing position vertically disposed between fluid inlets.

FIG. 4 is a schematic perspective view of a spin-rinse-dry (SRD) module of the present invention, incorporating rinsing and dissolving fluid inlets. FIG. 5 is a side cross sectional view of the SRD module of FIG. 4 and shows a substrate in a processing position vertically disposed between fluid inlets. The SRD station 212 may include one or more SRD modules 236 and one or more substrate pass-through cassettes 238. In one embodiment, the SRD station 212 includes two SRD modules 236, corresponding to the number of loading station transfer robots 228, and a substrate pass-through cassette 238 is positioned in close proximity to each SRD module 236. The substrate pass-through cassette 238 facilitates substrate transfer between the loading station 210 and the mainframe 214. The substrate pass-through cassette 238 provides access to and from both the loading station transfer robot 228 and a robot in the mainframe transfer station 216.

Referring to FIGS. 4 and 5, the SRD module 238 comprises a bottom 330*a* and a sidewall 330*b*, and an upper shield 330*c* which collectively define a SRD module bowl 330*d*, where the shield attaches to the sidewall and assists in retaining the fluids within the SRD module. Alternatively, a removable cover could also be used. A pedestal 336, located in the SRD module, includes a pedestal support 332 and a pedestal actuator 334. The pedestal 336 supports the substrate 338, shown in FIG. 5, on the pedestal upper surface during processing. The pedestal actuator 334 rotates the pedestal to spin the substrate and raises and lowers the pedestal during etching, rinsing, and certain spinning of the substrate. The substrate may be held in place on the pedestal by a plurality of clamps 337. The clamps pivot with centrifugal force and in one embodiment engage the substrate in the edge exclusion zone of the substrate. The clamps engage the substrate only when the substrate lifts off the pedestal during the processing.

The SRD module 236 is connected between the loading station 210 and the mainframe 214. The mainframe 214 generally comprises a mainframe transfer station 216 and a plurality of processing stations 218. Referring to FIGS. 2 and 3, the mainframe 214, as shown, includes two processing stations 218, each processing station 218 having two process cells 240. The mainframe transfer station 216 includes a mainframe transfer robot 242. The mainframe transfer robot 242 may comprise a plurality of individual robot arms 244 that provides independent access of substrates in the processing stations 218 and the SRD stations 212. As shown in FIG. 3, the mainframe transfer robot 242 comprises two robot arms 244, corresponding to the number of process cells 240 per processing station 218. Each robot arm 244 includes a robot blade or end effector 2404 for holding a substrate during a substrate transfer. In one embodiment, each robot arm 244 may operate independently of the other arm to facilitate independent transfers of substrates in the system. Alternatively, the robot arms 244 operate in a linked fashion such that one robot extends as the other robot arm retracts.

In one embodiment, the mainframe transfer station 216 includes a flipper robot 248 that facilitates transfer of a substrate from a face-up position on the robot blade 2404 of the mainframe transfer robot 242 to a face down position for a process cell 240, such as an ECP, that requires face-down processing of substrates. The flipper robot 248 includes a main body 250 that provides both vertical and rotational movements with respect to a vertical axis of the main body 250 and a flipper robot arm 252 that provides rotational movement along a horizontal axis along the flipper robot arm 252. In one embodiment, a vacuum suction gripper 254, disposed at the distal end of the flipper robot arm 252, holds the substrate as the substrate is flipped and transferred by the flipper robot 248. The flipper robot 248 positions a substrate into the process cell 240 for face-down processing. The details of the electroplating process cell will be discussed below.

Figure 24:
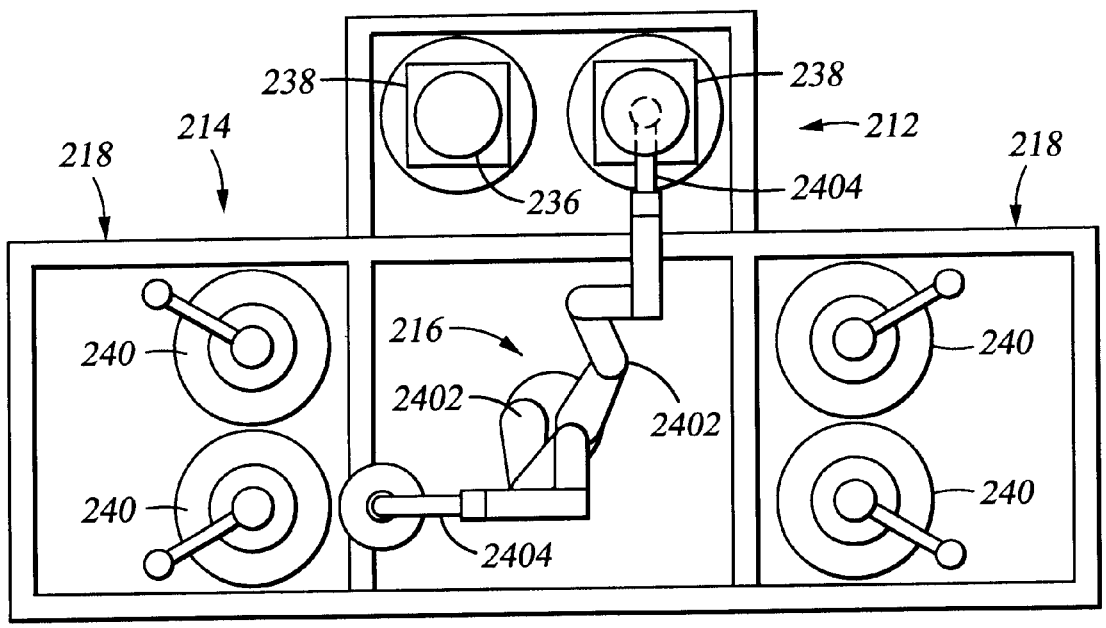
FIG. 24 is a top schematic view of a mainframe transfer robot having a flipper robot incorporated therein.

FIG. 24 is a top schematic view of a mainframe transfer robot incorporating a flipper robot. The mainframe transfer robot 242 as shown in FIG. 24 serves to transfer substrates between different stations attached the mainframe station, including the processing stations and the SRD stations. The mainframe transfer robot 242 includes a plurality of robot arms 2402, two are shown, and a flipper robot 2404 is attached as an end effector for each of the robot arms 2402. Flipper robots are generally known in the art and can be attached as end effectors for substrate handling robots, such as model RR701, available from Rorze Automation, Inc., located in Milpitas, Calif. The main transfer robot 242 comprising a flipper robot as the end effector is capable of transferring substrates between different stations attached to the mainframe as well as flipping the substrate being transferred to the desired surface orientation, i.e., substrate processing surface being face-down for the electroplating process. In one embodiment, the mainframe transfer robot 242 provides independent robot motion along the X-Y-Z axes by the robot arm 2402 and independent substrate flipping rotation by the flipper robot end effector 2404. By incorporating the flipper robot 2404 as the end effector of the mainframe transfer robot, the substrate transfer process is simplified because the step of passing a substrate from a mainframe transfer robot to a flipper robot is eliminated.

FIG. 6 is a cross sectional view of one embodiment of an electroplating process cell 400. The electroplating process cell 240 shown in FIGS. 2 and 3 may be configured as the electroplating process cell 400 shown in FIG. 6. The process cell 400 generally comprises a head assembly 410, a process cell 420 and an electrolyte solution collector 440. In one embodiment, the electrolyte solution collector 440 is secured onto the body 442 of the mainframe 214 over an opening 443 that defines the location for placement of the process cell 420. The electrolyte solution collector 440 includes an inner wall 446, an outer wall 448 and a bottom 447 connecting the walls. An electrolyte solution outlet 449 is disposed through the bottom 447 of the electrolyte solution collector 440 and connected to the electrolyte solution replenishing system 220 shown in FIG. 2 through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. In one embodiment, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process cell 420 to provide the spacing required to remove and/or replace the process cell 420 from the electroplating process cell 400. When the cantilever arm actuator 457 is extended, the cantilever arm 456 moves the head assembly 410 toward the process cell 420 to position the substrate in the head assembly 410 in a processing position.

The head assembly 410 generally comprises a substrate holder assembly 450 and a substrate assembly actuator 458. The substrate assembly actuator 458 is mounted onto the mounting plate 460, and includes a head assembly shaft 462 extending downwardly through the mounting plate 460. The lower end of the head assembly shaft 462 is connected to the substrate holder assembly 450 to position the substrate holder assembly 450 in a processing position and in a substrate loading position.

Figure 7:
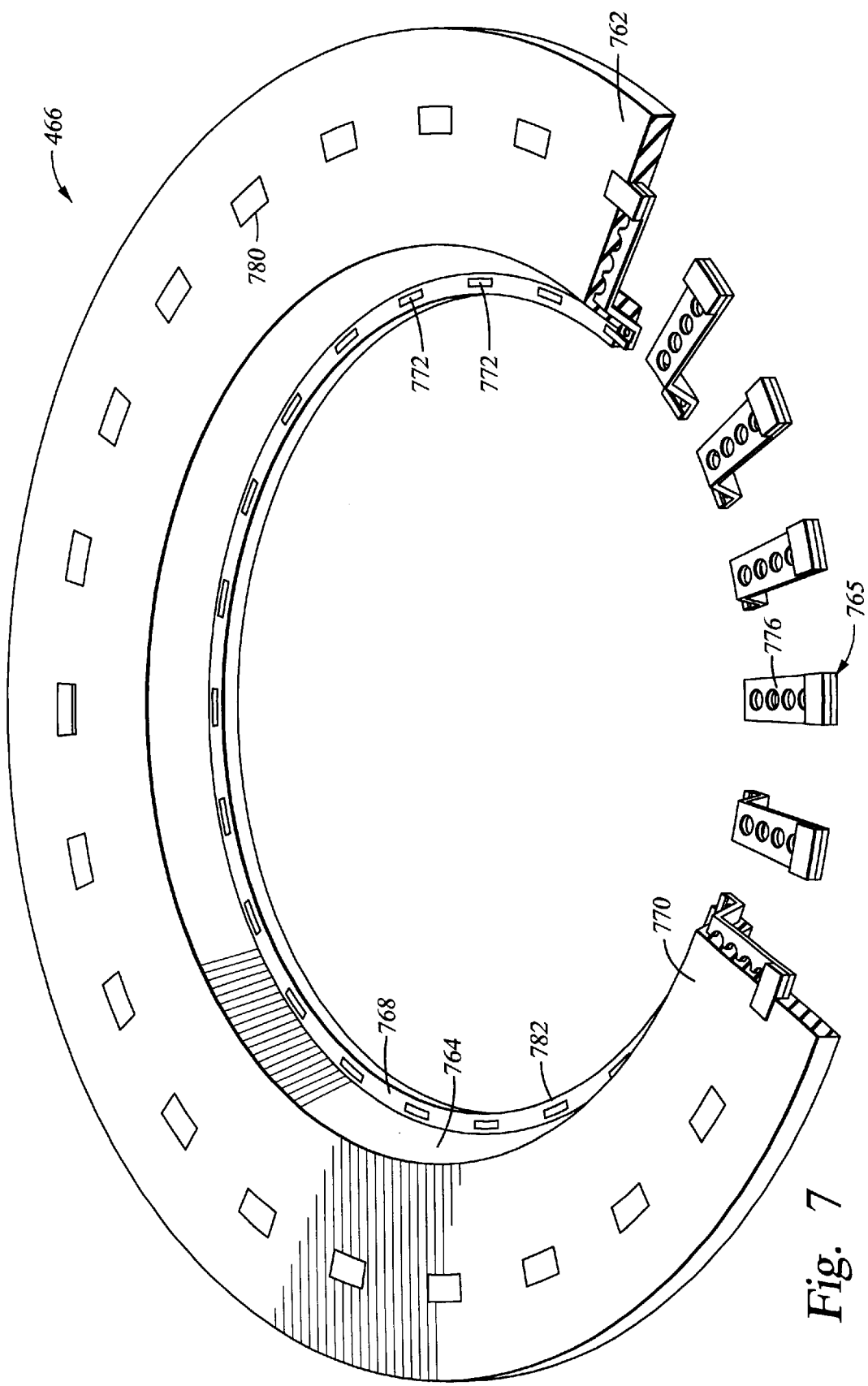
FIG. 7 is a partial cross sectional perspective view of an embodiment of a cathode contact ring.

The substrate holder assembly 450 comprises an electric contact 466. FIG. 7 is a cross sectional view of one embodiment of a electric contact 466. In general, the electric contact 466 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

Referring now to FIG. 7 in detail, one embodiment of electric contact 466 generally comprises a plurality of conducting members 765 at least partially disposed within an annular insulative body 770. The insulative body 770 is shown having a flange 762 and a downward sloping shoulder portion 764 leading to a substrate seating surface 768 located below the flange 762. The flange 762 and the substrate seating surface 768 lie in offset and substantially parallel planes. Thus, the flange 762 may be understood to define a first plane while the substrate seating surface 768 defines a second plane parallel to the first plane wherein the shoulder 764 is disposed between the two planes. However, electric contact design shown in FIG. 7 is intended to be merely illustrative. In another embodiment, the shoulder portion 764 may be of a steeper angle including a substantially vertical angle so as to be substantially normal to both the flange 762 and the substrate seating surface 768. Alternatively, the electric contact 466 may be substantially planar thereby eliminating the shoulder portion 764. However, for reasons described below, one embodiment comprises the shoulder portion 764 shown in FIG. 6 or some variation thereof.

The conducting members 765 are defined by a plurality of outer electric contact pads 780 annularly disposed on the flange 762, a plurality of inner electric contact pads 772 disposed on a portion of the substrate seating surface 768, and a plurality of embedded conducting connectors 776 which link the pads 772, 780 to one another. The conducting members 765 are isolated from one another by the insulative body 770. The insulative body may be made of a plastic such as polyvinylidenefluoride (PVDF), perfluoroalkoxy resin (PFA), TEFLON® (a registered trademark of the E. I. dupont de Nemours and Company) and TEFZEL® (a registered trademark of the E. I. duPont de Nemours and Company) or any other insulating material such as Alumina ($Al_2O_3$) or other ceramics. The outer contact pads 780 are electrically coupled to the power supply to deliver current and voltage to the inner contact pads 772 via the connectors 776 during processing. In turn, the inner contact pads 772 supply the current and voltage to a substrate by maintaining contact around a peripheral portion of the substrate. Thus, in operation the conducting members 765 act as discrete current paths electrically connected to a substrate.

Low resistivity, and conversely high conductivity, are directly related to good plating. To ensure low resistivity, the conducting members 765 may be made of such exemplary materials as copper (Cu), platinum (Pt), tantalum (Ta), titanium (Ti), gold (Au), silver (Ag), stainless steel or other conducting materials. Low resistivity and low contact resistance may also be achieved by coating the conducting members 765 with a conducting material. Thus, the conducting members 765 may, for example, be made of copper, that has a resistivity of approximately $2 \times 10^{-8}$ $\Omega \cdot m$, coated with platinum that has a resistivity of approximately $10.6 \times 10^{-8}$ $\Omega \cdot m$. Coatings such as tantalum nitride (TaN), titanium nitride (TiN), rhodium (Rh), Au, Cu, or Ag on a conductive base materials such as stainless steel, molybdenum (Mo), Cu, and Ti are also possible. Further, since the contact pads 772, 780 are typically separate units bonded to the conducting connectors 776, the contact pads 772, 780 may comprise one material, such as Cu, and the conducting members 765 another, such as stainless steel. Either or both of the pads 772, 180 and conducting connectors 776 may be coated with a conducting material. Additionally, because plating repeatability may be adversely affected by oxidation that acts as an insulator, the inner contact pads 772 comprise a material resistant to oxidation such as Pt, Ag, or Au.

Figures 8, 9:
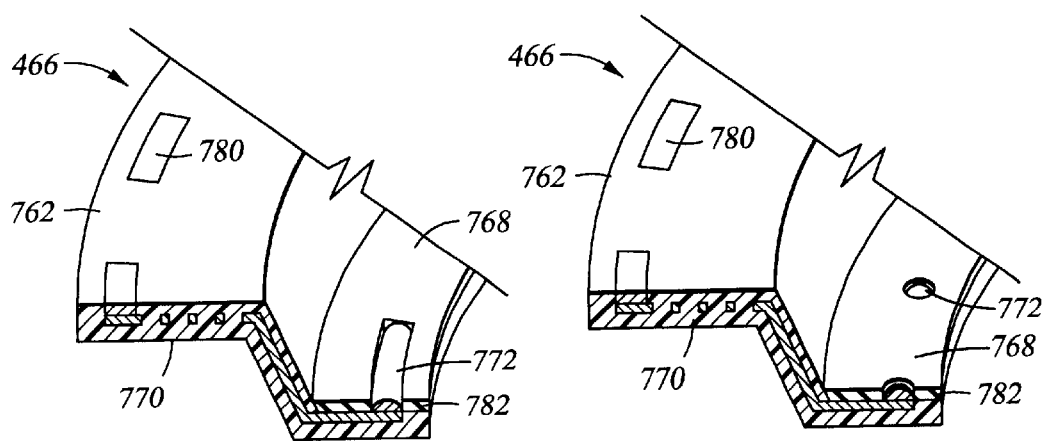
FIG. 8 is a cross sectional perspective view of the cathode contact ring of FIG. 7 showing an alternative embodiment of contact pads.
FIG. 9 is a cross sectional perspective view of the cathode contact ring of FIG. 7 showing an alternative embodiment of the contact pads and an isolation gasket.

In addition to being a function of the contact material, the total resistance of each circuit is dependent on the geometry, or shape, of the inner contact inner contact pads 772 and the force supplied by the contact ring 466. These factors define a constriction resistance, $R_{CR}$, at the interface of the inner contact pads 772 and the substrate seating surface 768 due to asperities between the two surfaces. Generally, as the applied force is increased the apparent area is also increased. The apparent area is, in turn, inversely related to $R_{CR}$ so that an increase in the apparent area results in a decreased $R_{CR}$. Thus, to minimize overall resistance it is desired to maximize force. The maximum force applied in operation is limited by the yield strength of a substrate which may be damaged under excessive force and resulting pressure. However, because pressure is related to both force and area, the maximum sustainable force is also dependent on the geometry of the inner contact pads 772. Thus, while the contact pads 772 may have a flat upper surface as in FIG. 7, other shapes may be used to advantage. For example, two shapes are shown in FIGS. 8 and 9. FIG. 8 shows a knife-edge contact pad and FIG. 9 shows a hemispherical contact pad. A person skilled in the art will readily recognize other shapes which may be used to advantage. A more complete discussion of the relation between contact geometry, force, and resistance is given in *Ney Contact Manual,* by Kenneth E. Pitney, The J. M. Ney Company, 1973, which is hereby incorporated by reference in its entirety.

The number of connectors 776 may be varied depending on the particular number of desired contact pads 772, shown in FIG. 7. For a 200 mm substrate, at least twenty-four connectors 776 are spaced equally over 360° in one embodiment. However, as the number of connectors reaches a critical level, the compliance of the substrate relative to the contact ring 466 is adversely affected. Therefore, while more than twenty-four connectors 776 may be used, contact uniformity may eventually diminish depending on the topography of the contact pads 772 and the substrate stiffness. Similarly, while less than twenty-four connectors 776 may be used, current flow is increasingly restricted and localized, leading to poor plating results. Since the dimensions of the process cell can be configured to suit a particular application. For example, the dimensions would be changed to compensate between a 200 and a 300 mm substrate.

Figure 10:
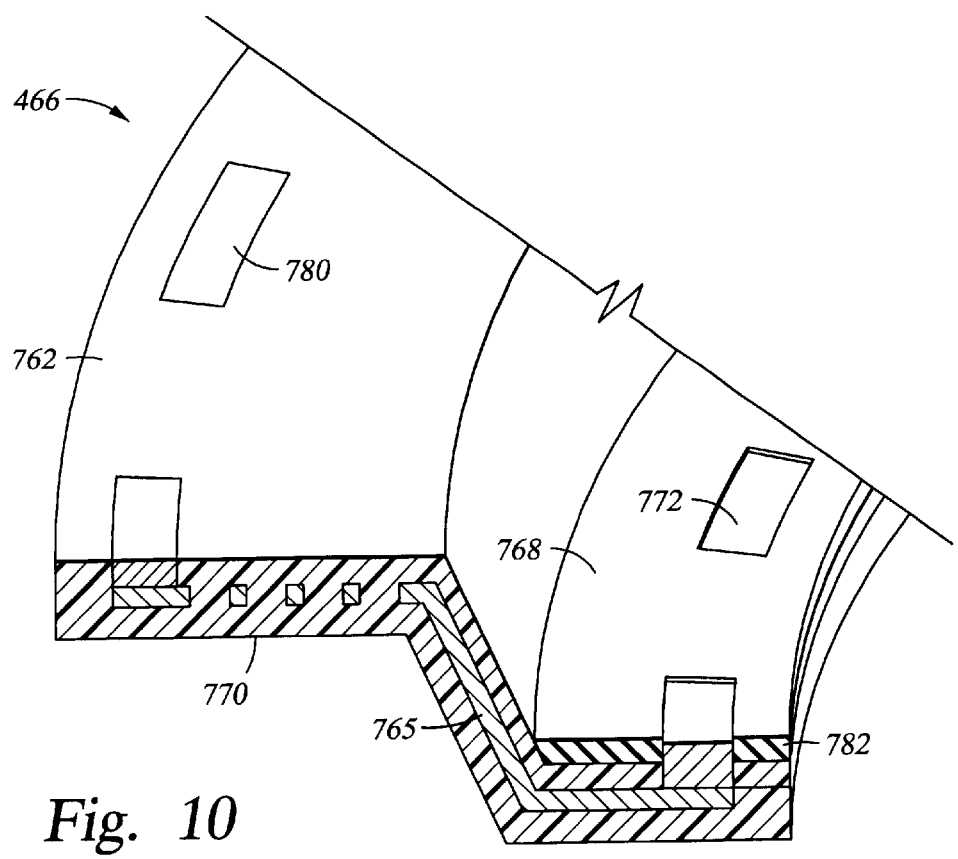
FIG. 10 is a cross sectional perspective view of the cathode contact ring of FIG. 7 showing an embodiment of the isolation gasket.

As shown in FIG. 10, the substrate seating surface 768 comprises an isolation gasket 782. The isolation gasket is disposed on the insulative body 770 and extends diametrically interior to the inner contact pads 772 to define the inner diameter of the contact ring 466. The isolation gasket 782 extends slightly above the inner contact pads 772, e.g., a few mils, and may in one embodiment comprise an elastomer such as VITON® (a registered trademark of the E. I. duPont de Nemours and Company of Wilmington, Del.), TEFLON® (a registered trademark of the E. I. duPont de Nemours and Company of Wilmington, Del.), buna rubber and/or the like. Where the insulative body 770 also comprises an elastomer the isolation gasket 782 may be of the same material. In the latter embodiment, the isolation gasket 782 and the insulative body 770 may be monolithic, ie., formed as a single piece. However, the isolation gasket 782 is formed separate from the insulative body 770 so that it may be easily removed for replacement or cleaning.

While FIG. 10 shows one embodiment of the isolation gasket 782 wherein the isolation gasket is seated entirely on the insulative body 770, FIGS. 8 and 9 show an alternative embodiment. In the latter embodiment, the insulative body 770 is partially machined away to expose the upper surface of the connecting member 776 and the isolation gasket 782 is disposed thereon. Thus, the isolation gasket 782 contacts a portion of the connecting member 776. This design requires less material to be used for the inner contact pads 772 that may be advantageous where material costs are significant such as when the inner contact pads 772 include gold.

During processing, the isolation gasket 782 maintains contact with a peripheral portion of the substrate plating surface and is compressed to provide a seal between the remaining electric contact 466 and the substrate. The seal prevents the electrolyte solution from contacting the edge and backside of the substrate. As noted above, maintaining a clean, pristine, contact surface is necessary to achieving high plating repeatability. Previous contact ring designs did not provide consistent plating results because contact surface topography varied over time. The contact ring limits, or substantially minimizes, deposits which would otherwise accumulate on the inner contact pads 772 and change their characteristics thereby producing highly repeatable, consistent, and uniform plating across the substrate plating surface.

Figure 11:
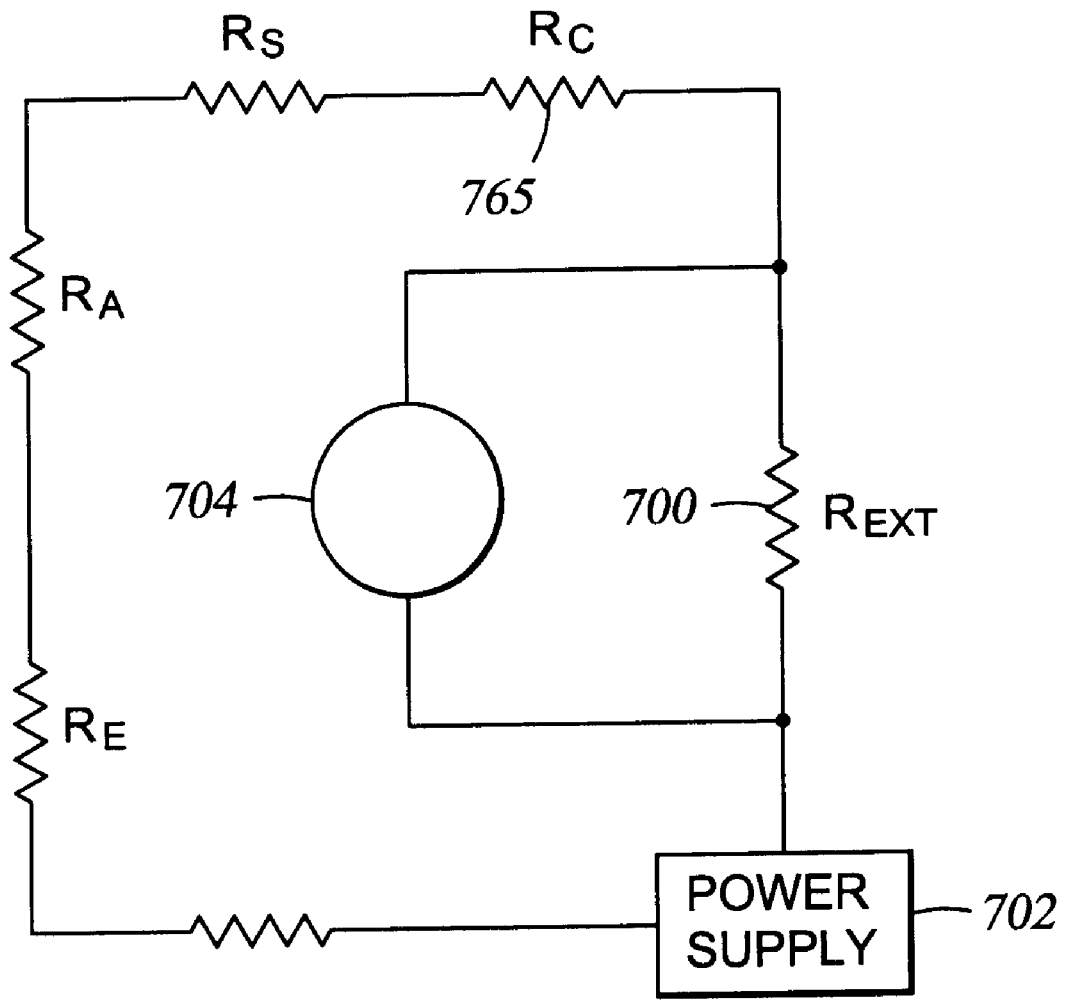
FIG. 11 is a simplified schematic diagram of the electric circuit through each contact.

FIG. 11 is a simplified schematic diagram representing a possible configuration of the electric circuit for the contact ring 466. To provide a uniform current distribution between the conducting members 765, an external resistor 700 is connected in series with each of the conducting members 765. The resistance value of the external resistor 700, represented as $R_{EXT}$, is greater than the resistance of any other component of the circuit. As shown in FIG. 11, the electric circuit through each conducting member 765 is represented by the resistance of each of the components connected in series with the power supply 702. $R_E$ represents the resistance of the electrolyte solution, which is typically dependent on the distance between the anode and the cathode contact ring and the chemical composition of the electrolyte solution. Thus, $R_A$ represents the resistance of the electrolyte solution adjacent the substrate plating surface 754. $R_S$ represents the resistance of the substrate plating surface 754, and $R_C$ represents the resistance of the cathode conducting members 765 plus the constriction resistance resulting at the interface between the inner contact pads 772 and the substrate plating layer 754. Generally, the resistance value of the external resistor ($R_{EXT}$) is at least as much as $\Sigma R$, where $\Sigma R$ equals the sum of $R_E$, $R_A$, $R_S$ and $R_C$. The resistance value of the external resistor ($R_{EXT}$) is greater than $\Sigma R$ such that $\Sigma R$ is negligible and the resistance of each series circuit approximates $R_{EXT}$.

Typically, one power supply is connected to all of the outer contact pads 780 of the electric contact 466, resulting in parallel circuits through the inner contact pads 772. However, as the inner contact pad-to-substrate interface resistance varies with each inner contact pad 772, more current will flow, and thus more plating will occur, at the site of lowest resistance. However, by placing an external resistor in series with each conducting member 765, the value or quantity of electric current passed through each conducting member 765 becomes controlled mainly by the value of the external resistor. As a result, the variations in the electrical properties between each of the inner contact pads 772 do not affect the current distribution on the substrate. The uniform current density applied across the plating surface contributes to a uniform plating thickness of the metal film deposited on the seed layer on the substrate. The external resistors also provide a uniform current distribution between different substrates of a process-sequence.

Although the contact ring 466 is designed to resist deposit buildup on the inner contact pads 772, over multiple substrate plating cycles the substrate-pad interface resistance may increase, eventually reaching an unacceptable value. An electronic sensor/alarm 704 can be connected across the external resistor 700 to monitor the voltage/current across the external resistor to address this problem. If the voltage/current across the external resistor 700 falls outside of a preset operating range that is indicative of a high substrate-pad resistance, the sensor/alarm 704 triggers corrective measures such as shutting down the plating process until the problems are corrected by an operator. Alternatively, a separate power supply can be connected to each conducting member 765 and can be separately controlled and monitored to provide a uniform current distribution across the substrate. A very smart system (VSS) may also be used to modulate the current flow. The VSS typically comprises a processing unit and any combination of devices known in the industry used to supply and/or control current such as variable resistors, separate power supplies, etc. As the physiochemical, and hence electrical, properties of the inner contact pads 772 change over time, the VSS processes and analyzes data feedback. The data is compared to pre-established setpoints and the VSS then makes appropriate current and voltage alterations to ensure uniform deposition.

Figure 18:
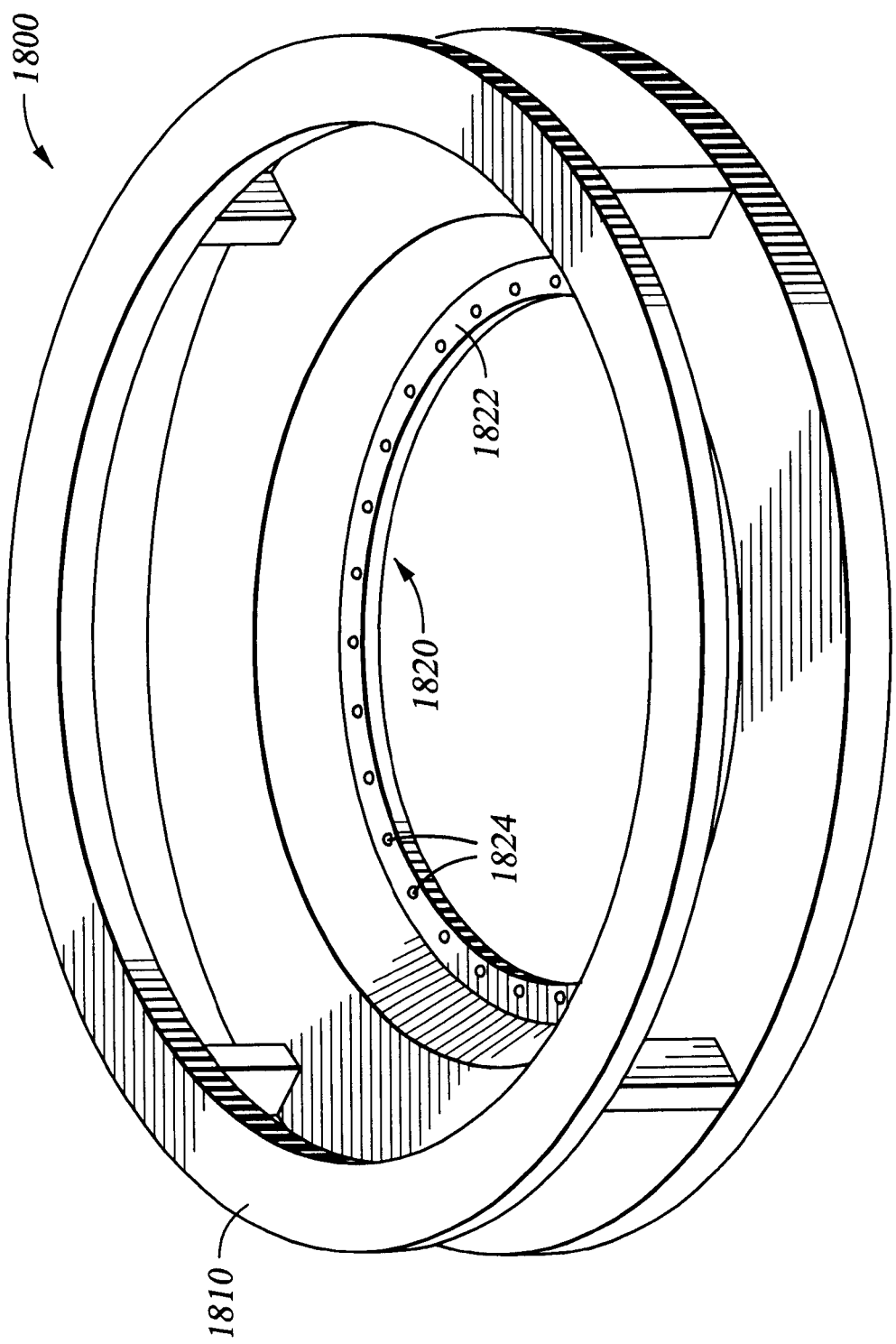
FIG. 18 is a perspective view of an alternative embodiment of a cathode contact ring.

FIG. 18 is a perspective view of an alternative embodiment of a cathode contact ring. The cathode contact ring 1800 as shown in FIG. 18 comprises a conductive metal or a metal alloy, such as stainless steel, copper, silver, gold, platinum, titanium, tantalum, and other conductive materials, or a combination of conductive materials, such as stainless steel coated with platinum. The cathode contact ring 1800 includes an upper mounting portion 1810 adapted for mounting the cathode contact ring onto the substrate holder assembly and a lower substrate receiving portion 1820 adapted for receiving a substrate therein. The substrate receiving portion 1820 includes an annular substrate seating surface 1822 having a plurality of contact pads or bumps 1824 disposed thereon and evenly spaced apart. When a substrate is positioned on the substrate seating surface 1822, the contact pads 1824 physically contact a peripheral region of the substrate to provide electric contact to the electroplating seed layer on the substrate deposition surface. The contact pads 1824 are coated with a noble metal, such as platinum or gold, that is resistant to oxidation.

The exposed surfaces of the cathode contact ring, except the surfaces of the contact pads that come in contact with the substrate, are treated to provide hydrophilic surfaces or coated with a material that exhibits hydrophilic properties. Hydrophilic materials and hydrophilic surface treatments are known in the art. One company providing a hydrophilic surface treatment is Millipore Corporation, located in Bedford, Mass. The hydrophilic surface significantly reduces beading of the electrolyte solution on the surfaces of the cathode contact ring and promotes smooth dripping of the electrolyte solution from the cathode contact ring after the cathode contact ring is removed from the electroplating bath or electrolyte solution. By providing hydrophilic surfaces on the cathode contact ring that facilitate run-off of the electrolyte solution, plating defects caused by residual electrolyte solution on the cathode contact ring are significantly reduced. The inventors also contemplate application of this hydrophilic treatment or coating in other embodiments of cathode contact rings to reduce residual electrolyte solution beading on the cathode contact ring and the plating defects on a subsequently processed substrate that may result therefrom.

Figure 12:
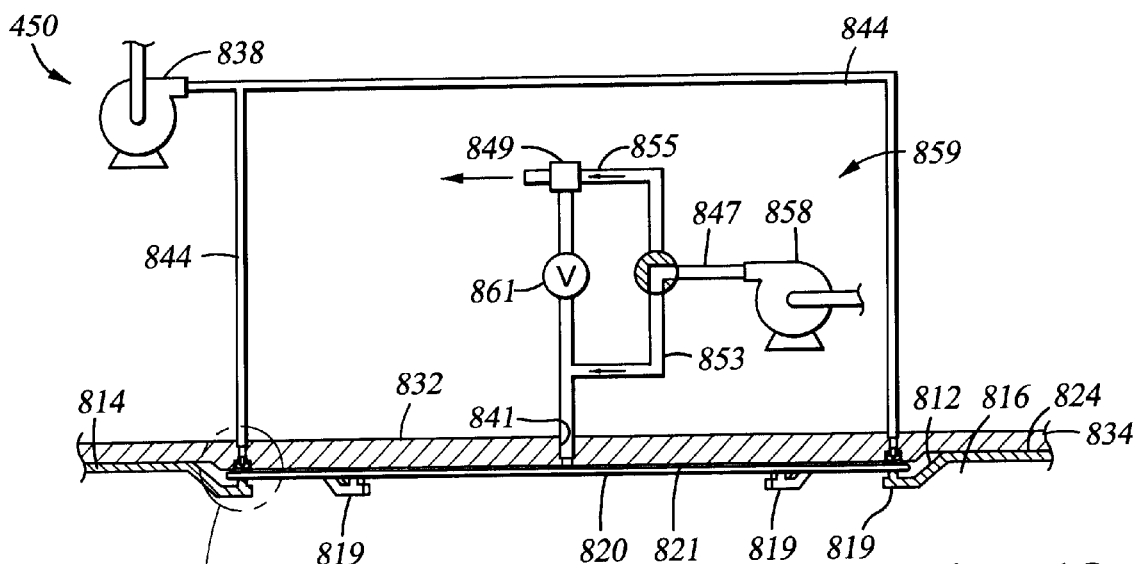
FIG. 12 is a cross sectional view of one embodiment of a substrate assembly.
Figure 12A:
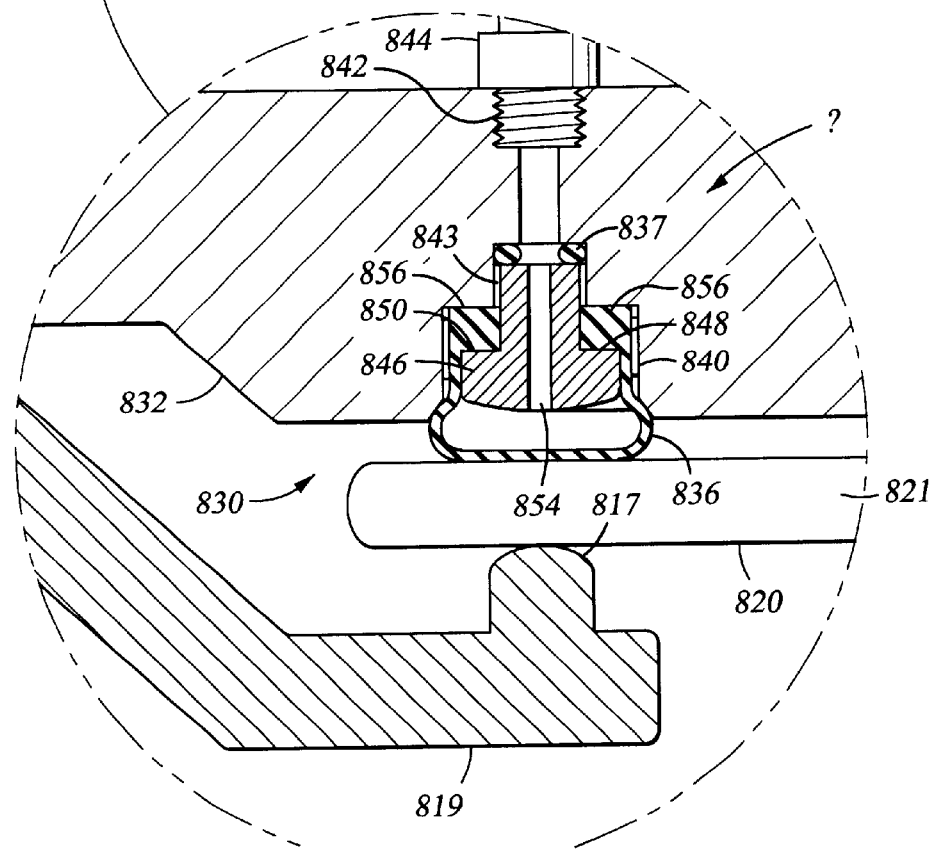
FIG. 12A is an enlarged cross sectional view of an embodiment of the bladder area of FIG. 12.

Referring to FIGS. 12 and 12A, the substrate holder assembly 464 is positioned above the electric contact 466 and comprises a bladder assembly 470 that provides pressure to the backside of a substrate and ensures electric contact between the substrate plating surface and the electric contact 466. The inflatable bladder assembly 470 is disposed on a substrate holder plate 832. A bladder 836 disposed on a lower surface of the substrate holder plate 832 is thus located opposite and adjacent to the contacts on the electric contact 466 with the substrate 821 interposed therebetween. A fluid source 838 supplies a fluid, i.e., a gas or liquid, to the bladder 836 allowing the bladder 836 to be inflated to varying degrees.

Figure 13:
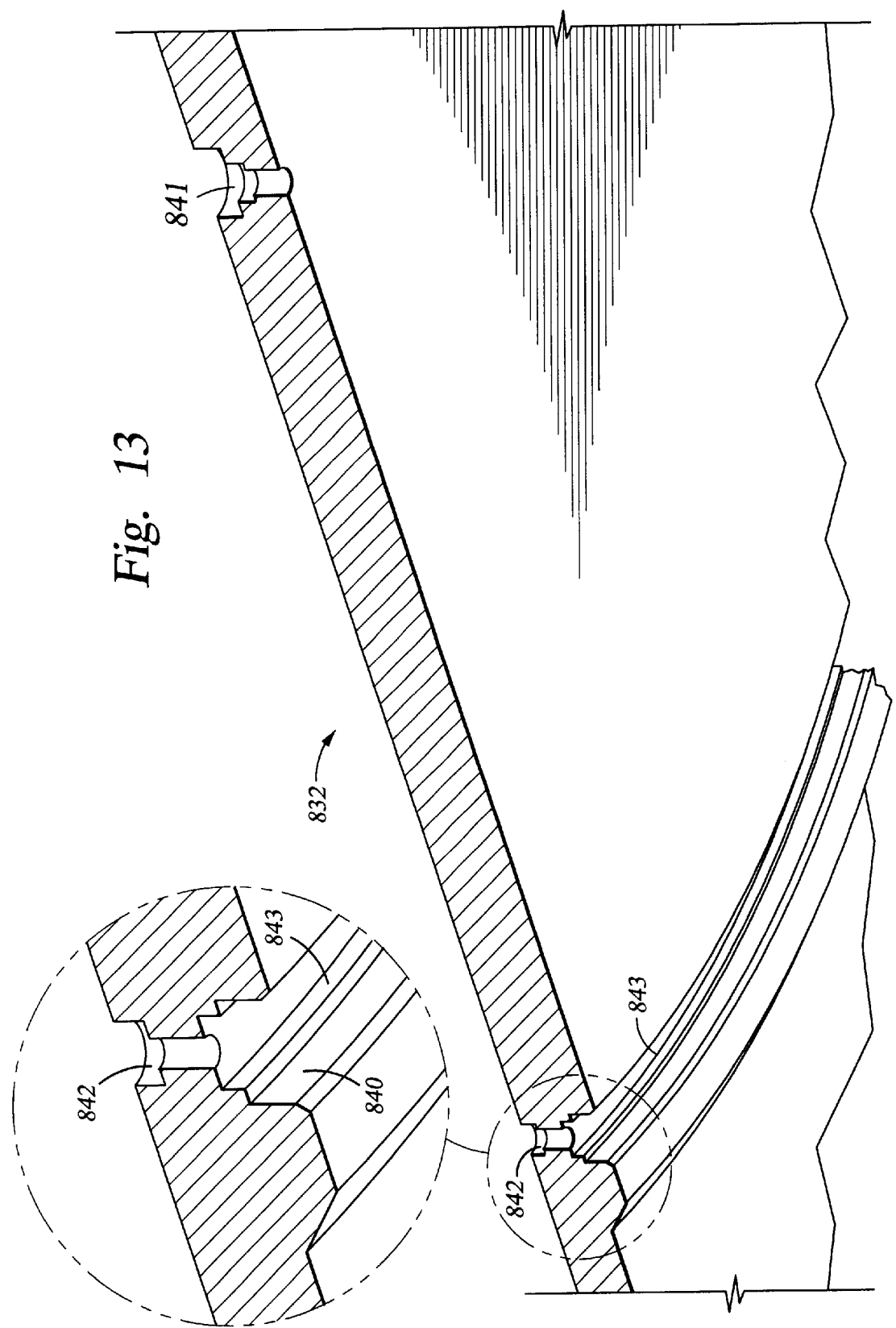
FIG. 13 is a partial cross sectional view of one embodiment of a substrate holder plate.

Referring now to FIGS. 12, 12A, and 13, the details of the bladder assembly 470 will be discussed. The substrate holder plate 832 is shown as substantially disc-shaped having an annular recess 840 formed on a lower surface and a centrally disposed vacuum port 841. One or more inlets 842 are formed in the substrate holder plate 832 and lead into the relatively enlarged annular mounting channel 843 and the annular recess 840. Quick-disconnect hoses 844 couple the fluid source 838 to the inlets 842 to provide a fluid thereto. The vacuum port 841 is attached to a vacuum/pressure pumping system 859 adapted to selectively supply a pressure or create a vacuum at a backside of the substrate 821. The pumping system 859, shown in FIG. 12, comprises a pump 845, a cross-over valve 847, and a vacuum ejector 849 commonly known as a venturi. One vacuum ejector that may be used is available from SMC Pneumatics, Inc., of Indianapolis, Ind. The pump 845 may be a commercially available compressed gas source and is coupled to one end of a hose 851, the other end of the hose 851 being coupled to the vacuum port 841. The hose 851 is split into a pressure line 853 and a vacuum line 855 having the vacuum ejector 849 disposed therein. Fluid flow is controlled by the cross-over valve 847 which selectively switches communication with the pump 845 between the pressure line 853 and the vacuum line 855. The cross-over valve has an OFF setting whereby fluid is restricted from flowing in either direction through hose 851. A shut-off valve 861 disposed in hose 851 prevents fluid from flowing from pressure line 855 upstream through the vacuum ejector 849. The desired direction of fluid flow is indicated by arrows.

Where the fluid source 838 is a gas supply it may be coupled to hose 851 thereby eliminating the need for a separate compressed gas supply, i.e.. pump 845. Further, a separate gas supply and vacuum pump may supply the backside pressure and vacuum conditions. While one embodiment allows for both a backside pressure as well as a backside vacuum, a simplified embodiment may comprise a pump capable of supplying only a backside vacuum. However, as will be explained below, deposition uniformity may be improved where a backside pressure is provided during processing. Therefore, a vacuum ejector and a cross-over valve may be included.

Figure 14:
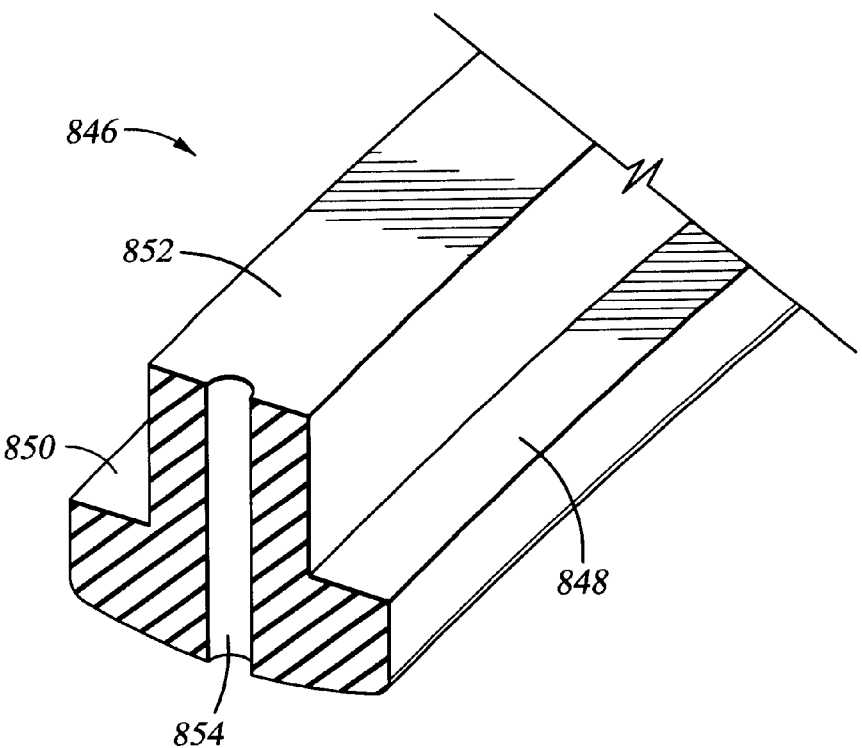
FIG. 14 is a partial cross sectional view of one embodiment of a manifold.

Referring now to FIGS. 12A and 14, a substantially circular ring-shaped manifold 846 is disposed in the annular recess 840. The manifold 846 comprises a mounting rail 852 disposed between an inner shoulder 848 and an outer shoulder 850. The mounting rail 852 is adapted to be at least partially inserted into the annular mounting channel 843. A plurality of fluid outlets 854 formed in the manifold 846 provide communication between the inlets 842 and the bladder 836. Seals 837, such as O-rings, are disposed in the annular manifold channel 843 in alignment with the inlet 842 and outlet 854 and secured by the substrate holder plate 832 to ensure an airtight seal. Conventional fasteners such as screws may be used to secure the manifold 846 to the substrate holder plate 832 via cooperating threaded bores formed in the manifold 846 and the substrate holder plate 832.

Figure 15:
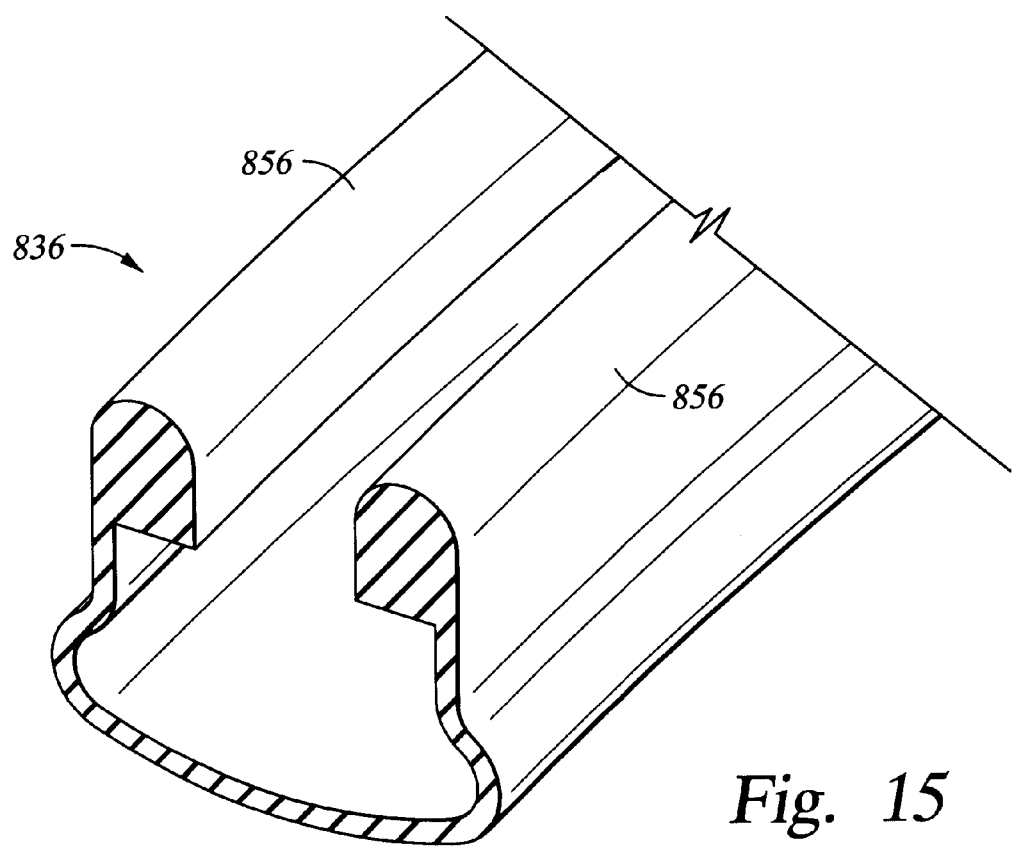
FIG. 15 is a partial cross sectional view of one embodiment of a bladder.

Referring now to FIG. 15, the bladder 836 is shown, in section, as an elongated substantially semi-tubular piece of material having annular lip seals 856, or nodules, at each edge. In FIG. 12A, the lip seals 856 are shown disposed on the inner shoulder 848 and the outer shoulder 850. A portion of the bladder 836 is compressed against the walls of the annular recess 840 by the manifold 846 which has a width slightly less, e.g., a few millimeters, than the annular recess 840. Thus, the manifold 846, the bladder 836, and the annular recess 840 cooperate to form a fluid-tight seal. To prevent fluid loss, the bladder 836 includes (is formed entirely from or is coated with) some fluid impervious material such as silicon rubber or any comparable elastomer which is chemically inert with respect to the electrolyte solution and exhibits reliable elasticity. Where needed a compliant covering 857 may be disposed over the bladder 836, as shown in FIG. 15, and secured by means of an adhesive or thermal bonding. The covering 857 preferably comprises an elastomer such as VITON®, buna rubber or the like, which may be reinforced by KEVLAR® (a registered trademark of the E. I. duPont de Nemours and Company of Wilmington, Del.), for example. In one embodiment, the covering 857 and the bladder 836 comprise the same material. The covering 857 has particular application where the bladder 836 is liable to rupturing. Alternatively, the bladder 836 thickness may simply be increased during its manufacturing to reduce the likelihood of puncture. The exposed surface of the bladder 836, if uncovered, and the exposed surface of the covering 857 my be coated or treated to provide a hydrophilic surface. This coating promotes dripping and removal of the residual electrolyte solution after the head assembly is lifted above the process cell.

The precise number of inlets 842 and outlets 854 may be varied according to the particular application. For example, while FIG. 12 shows two inlets with corresponding outlets, an alternative embodiment could employ a single fluid inlet that supplies fluid to the bladder 836.

In operation, the substrate 821 is introduced into the container body 802 by securing it to the lower side of the substrate holder plate 832. This is accomplished by engaging the pumping system 159 to evacuate the space between the substrate 821 and the substrate holder plate 832 via port 841 thereby creating a vacuum condition. The bladder 836 is then inflated by supplying a fluid such as air or water from the fluid source 838 to the inlets 842. The fluid is delivered into the bladder 836 via the manifold outlets 854, thereby pressing the substrate 821 uniformly against the contacts of the electric contact 466. The electroplating process is then carried out. Electrolyte solution is then pumped into the process cell 420 toward the substrate 821 to contact the exposed substrate plating surface 820. The power supply provides a negative bias to the substrate plating surface 820 via the electric contact 466. As the electrolyte solution is flowed across the substrate plating surface 820, ions in the electrolytic solution are attracted to the surface 820 and deposit on the surface 820 to form the desired film.

Because of its flexibility, the bladder 836 deforms to accommodate the asperities of the substrate backside and contacts of the electric contact 466 thereby mitigating misalignment with the conducting electric contact 466. The compliant bladder 836 prevents the electrolyte solution from contaminating the backside of the substrate 821 by establishing a fluid tight seal at a portion close to the perimeter of a backside of the substrate 821. Once inflated, a uniform pressure is delivered downward toward the electric contact 466 to achieve substantially equal force at all points where the substrate 821 and electric contact 466 interface. The force can be varied as a function of the pressure supplied by the fluid source 838. Further, the effectiveness of the bladder assembly 470 is not dependent on the configuration of the electric contact 466. For example, while FIG. 12 shows a pin configuration having a plurality of discrete contact points, the electric contact 466 may also be a continuous surface.

Because the force delivered to the substrate 821 by the bladder 836 is variable, adjustments can be made to the current flow supplied by the contact ring 466. As described above, an oxide layer may form on the electric contact 466 and act to restrict current flow. However, increasing the pressure of the bladder 836 may counteract the current flow restriction due to oxidation. As the pressure is increased, the malleable oxide layer is compromised and superior contact between the electric contact 466 and the substrate 821 results. The effectiveness of the bladder 836 in this capacity may be further improved by altering the geometry of the electric contact 466. For example, a knife-edge geometry is likely to penetrate the oxide layer more easily than a dull rounded edge or flat edge.

Additionally, the fluid tight seal provided by the inflated bladder 836 allows the pump 845 to maintain a backside vacuum or pressure either selectively or continuously, before, during, and after processing. Generally, however, the pump 845 is run to maintain a vacuum only during the transfer of substrates to and from the electroplating process cell 400 because it has been found that the bladder 836 is capable of maintaining the backside vacuum condition during processing without continuous pumping. Thus, while inflating the bladder 836, as described above, the backside vacuum condition is simultaneously relieved by disengaging the pumping system 859, e.g., by selecting an off position on the cross-over valve 847. Disengaging the pumping system 859 may be abrupt or comprise a gradual process whereby the vacuum condition is ramped down. Ramping allows for a controlled exchange between the inflating bladder 836 and the simultaneously decreasing backside vacuum condition. This exchange may be controlled manually or by computer.

As described above, continuous backside vacuum pumping while the bladder 836 is inflated is not needed and may actually cause the substrate 820 to buckle or warp leading to undesirable deposition results. It may be desirable to provide a backside pressure to the substrate 820 in order to cause a "bowing" effect of the substrate to be processed. Bowing of the substrate may results in superior deposition on the substrate since portions, such as the periphery, of the substrate are displaced by the bowing nearer to the anode than other portions. The bowing may make the metal film deposition more uniform if portions of the seed layer having a lesser current density are displaced closer to the anode to make the electric current density more uniform across the substrate. Thus, pumping system 859 is capable of selectively providing a vacuum or pressure condition to the substrate backside. For a 200 mm substrate, for example, a backside pressure up to 5 psi is selected to bow the substrate. The degree of bowing is variable according to the pressure supplied by pumping system 859. Because substrates typically exhibit some measure of pliability, a backside pressure causes the substrate to bow or assume a convex shape relative to the upward flow of the electrolyte solution.

Those skilled in the art will readily recognize other embodiments. For example, while FIG. 12A shows a bladder 836 having a surface area sufficient to cover a relatively small perimeter portion of the substrate backside at a diameter substantially equal to the electric contact 466. The geometric configuration of the bladder assembly 470 can be varied. Thus, the bladder assembly may be constructed using more fluid impervious material to cover an increased surface area of the substrate 821.

Figure 19:
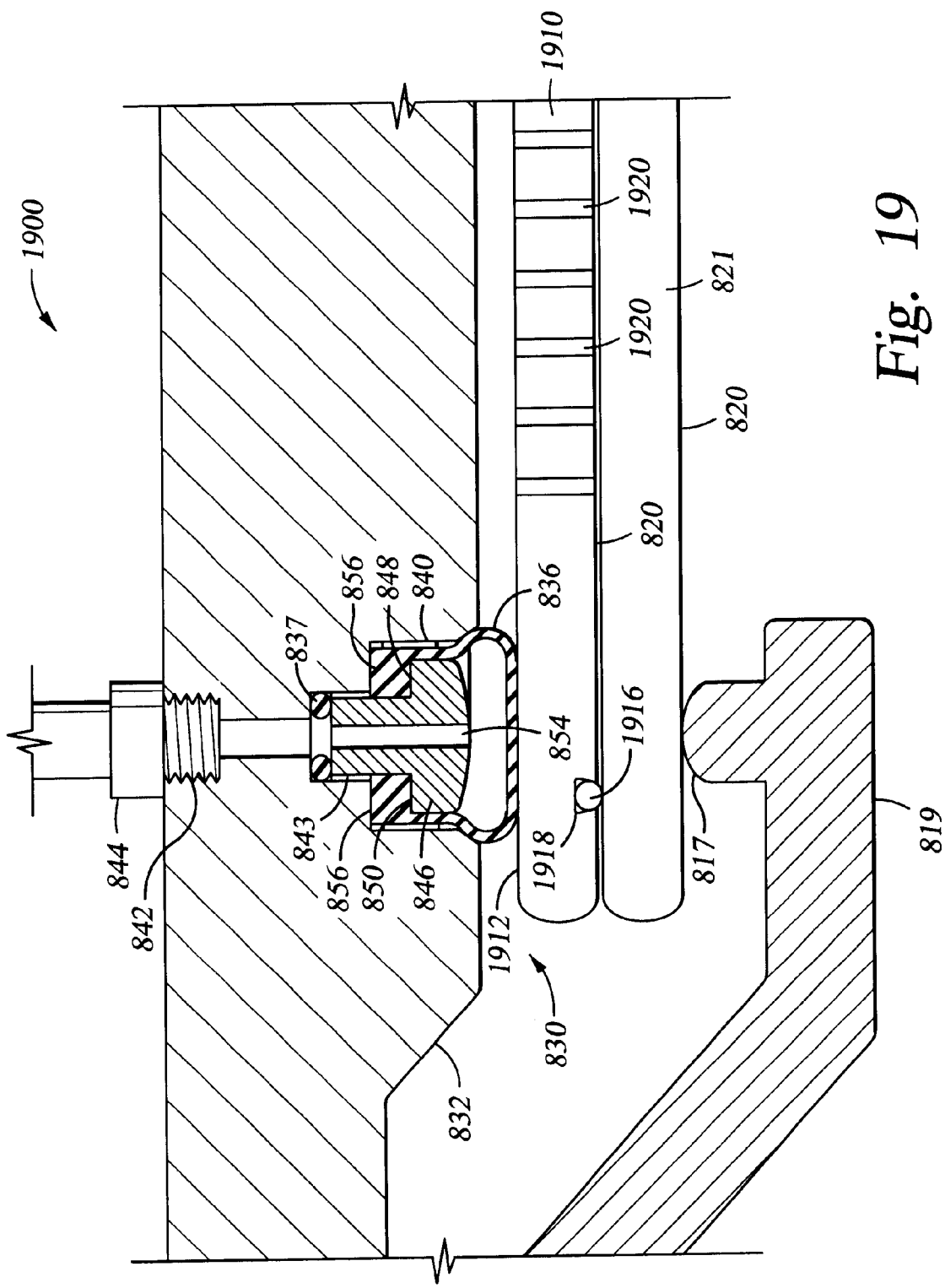
FIG. 19 is a partial cross sectional view of an alternative embodiment of seal to be used in a substrate holder assembly.

FIG. 19 is a partial cross sectional view of an alternative embodiment of a substrate holder assembly. The alternative substrate holder assembly 1900 comprises a bladder assembly 470, as described above, having the inflatable bladder 836 attached to the back surface of an intermediary substrate holder plate 1910. A portion of the inflatable bladder 836 is sealingly attached to the back surface 1912 of the intermediary substrate holder plate 1910 using an adhesive or other bonding material. The front surface 1914 of the intermediary substrate holder plate 1910 is adapted to receive a substrate 821 to be processed. An elastomeric o-ring 1916 is disposed in an annular groove 1918 on the front surface 1914 of the intermediary substrate holder plate 1910 to contact a peripheral portion of the substrate back surface. The elastomeric o-ring 1916 provides a seal between the substrate back surface and the front surface of the intermediary substrate holder plate. The intermediary substrate holder plate includes a plurality of bores or holes 1920 extending through the plate that are in fluid communication with the vacuum port 841. The plurality of holds 1920 facilitate securing the substrate on the substrate holder plate using a vacuum force applied to the backside of the substrate. According to this alternative embodiment of the substrate holder assembly, the inflatable bladder does not directly contact a substrate being processed, and thus the risk of cutting or damaging the inflatable bladder during substrate transfers is significantly reduced. The elastomeric O-ring 1916 may be coated or treated to provide a hydrophilic surface for contacting the substrate. The elastomeric O-ring 1916 is replaced as needed to ensure proper contact and seal to the substrate.

Figure 25:
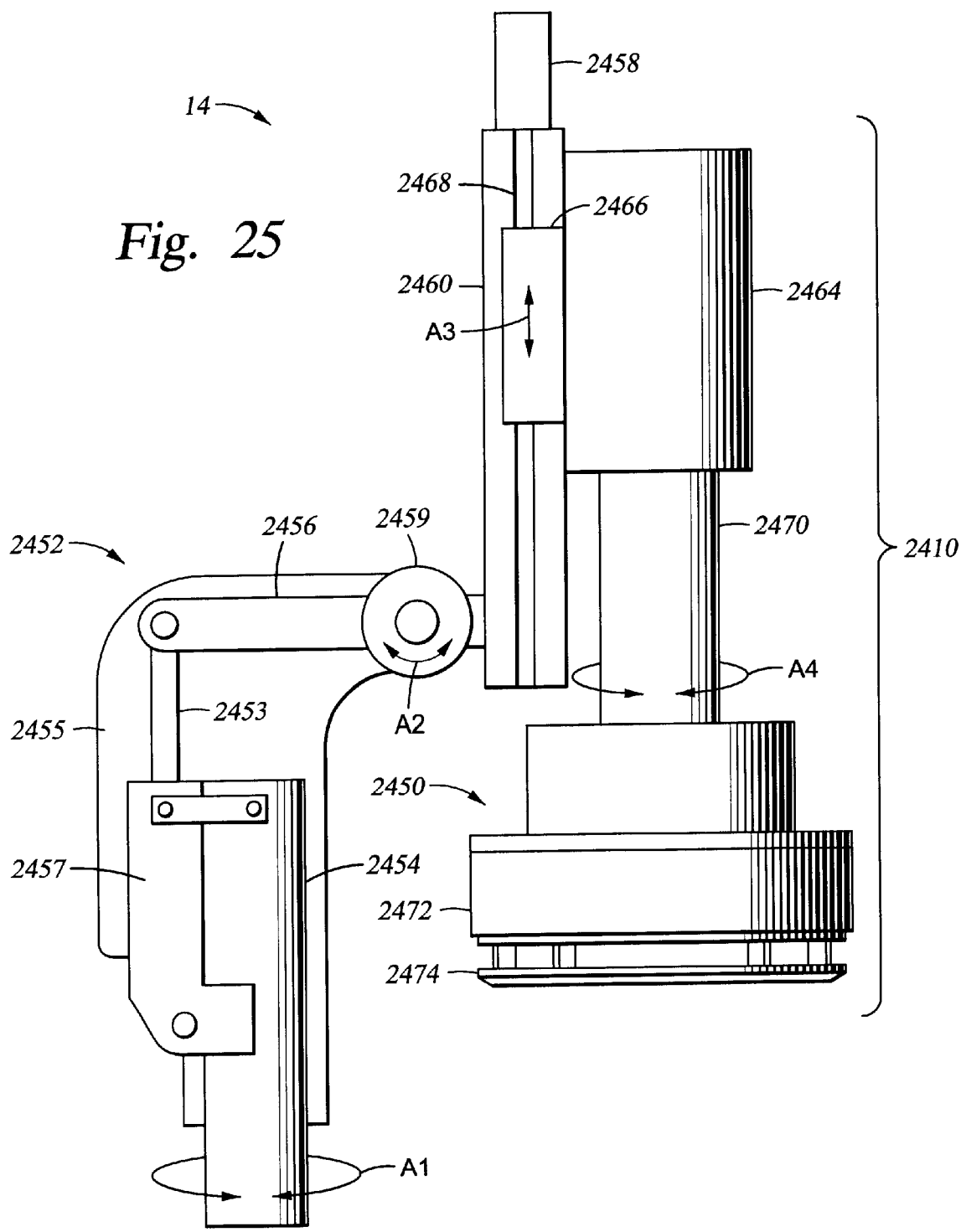
FIG. 25 is an alternative embodiment of the substrate holder system having a rotatable head assembly.

FIG. 25 is an alternative embodiment of the substrate holder system 14 having a rotatable head assembly 2410. In one embodiment, a rotational actuator is disposed on the cantilevered arm and attached to the head assembly to rotate the head assembly during substrate processing. The rotatable head assembly 2410 is mounted onto a head assembly frame 2452. The alternative embodiment of head assembly flame 2452 and the rotatable head assembly 2410 are mounted onto the mainframe similarly to the head assembly frame 452 and head assembly 410 as shown in FIG. 6 and described above. The head assembly frame 2452 includes a mounting post 2454, a post cover 2455, and a cantilever arm 2456. The mounting post 2454 is mounted onto the body of the mainframe 214, and the post cover 2455 covers a top portion of the mounting post 2454. In one embodiment, the mounting post 454 provides rotational movement, as indicated by arrow A1, with respect to a vertical axis along the mounting post to allow rotation of the head assembly frame 2452. The cantilever arm 2456 extends laterally from an upper portion of the mounting post 2454 and is pivotally connected to the post cover 2455 at the pivot joint 2459. The rotatable head assembly 2410 is attached to a mounting slide 2460 disposed at the distal end of the cantilever arm 2456. The mounting slide 2460 guides the vertical motion of the head assembly 2410. A head lift actuator 2458 is disposed on top of the mounting slide 2460 to provide vertical displacement of the head assembly 2410.

The lower end of the cantilever arm 2456 is connected to the shaft 2453 of a cantilever arm actuator 2457, such as a pneumatic cylinder or a lead-screw actuator, mounted on the mounting post 2454. The cantilever arm actuator 2457 provides pivotal movement, as indicated by arrow A2, of the cantilever arm 2456 with respect to the pivot joint 2459 between the cantilever arm 2456 and the post cover 2454. When the cantilever arm actuator 2457 is retracted, the cantilever arm 2456 moves the head assembly 2410 away from the process cell 420. The movement of the head assembly 2410 provide the spacing required to remove and/or replace the process cell 420 from the electroplating process cell 240. When the cantilever arm actuator 2457 is extended, the cantilever arm 2456 moves the head assembly 2410 toward the process cell 420 to position the substrate in the head assembly 2410 in a processing position.

The rotatable head assembly 2410 includes a rotating actuator 2464 slideably connected to the mounting slide 2460. The shaft 2468 of the head lift actuator 2458 is inserted through a lift guide 2466 attached to the body of the rotating actuator 2464. In an embodiment, the shaft 2468 is a lead-screw type shaft that moves the lift guide, as indicated by arrows A3, between various vertical positions. The rotating actuator 2464 is connected to the substrate holder assembly 2450 through the shaft 2470 and rotates the substrate holder assembly 2450, as indicated by arrows A4. The substrate holder assembly 2450 includes a bladder assembly, such as the embodiments described above with respect to FIGS. 12–15 and 19, and a cathode contact ring, such as the embodiments described above with respect to FIGS. 7–10 and 18.

The rotation of the substrate during the electroplating process generally enhances the deposition results. In one embodiment, the head assembly is rotated between about 2 rpm and about 200 rpm, preferably between about 20 and 40 rpm, when the substrate is immersed in the electrolyte solution, during the electroplating process. The substrate holder assembly 2472 can be rotated to impart rotation to the substrate as the substrate holder system 14 lowers the seed layer on the substrate into contact with the electrolyte solution in the process cell. The head assembly is raised to remove the seed layer on the substrate from the electrolyte solution in the process cell. The head assembly is preferably rotated at a high speed, i.e., between about 100 and 2500 rpm, after the head assembly is lifted from the process cell to enhance removal of residual electrolyte solution from the head assembly by centrifugel force.

In one embodiment, the uniformity of the deposited film has been improved within about 2%, i.e., maximum deviation of deposited film thickness is at about 2% of the average film thickness, while standard electroplating processes typically achieves uniformity at best within about 5.5%. However, rotation of the head assembly is not necessary to achieve uniform electroplating deposition in some instances, particularly where the uniformity of electroplating deposition is achieved by adjusting the processing parameters, such as the chemicals in the electrolyte solution, electrolyte solution flow and other parameters.

Referring back to FIG. 6, a cross sectional view of an electroplating process cell 400, the substrate holder assembly 450 is positioned above the process cell 420. The process cell 420 generally comprises a bowl 430, a container body 472, an anode assembly 474 and a filter 476. In one embodiment, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, PLEXIGLAS® (acrylic), lexane, PVC, CPVC, and PVDF. Alternatively, the container body 472 can be made from a coated metal, such as stainless steel, nickel and titanium. The coated metal is coated with an insulating layer such as TEFLON® (a trademark of the E. I. duPont de Nemoirs Company of Wilmington, Del.), PVDF, plastic, rubber and other combinations of materials that do not dissolve in the electrolyte solution. The insulating layer can be electrically insulated from the electrodes, i.e., the anode and cathode of the ECP system. The container body 472 is sized and adapted to conform to the substrate plating surface and the shape of the of a substrate being processed through the system, typically circular or rectangular in shape. One embodiment of the container body 472 comprises a cylindrical ceramic tube having an inner diameter that has about the same dimension as or slightly larger than the substrate diameter. Rotational movement typically required in typical ECP systems is not required to achieve uniform plating results when the size of the container body conforms to about the size of the substrate plating surface.

An upper portion of the container body 472 extends radially outwardly to form an annular weir 478. The weir 478 extends over the inner wall 446 of the electrolyte solution collector 440 and allows the electrolyte solution to flow into the electrolyte solution collector 440. The upper surface of the weir 478 matches the lower surface of the electric contact 466. The upper surface of the weir 478 includes an inner annular flat portion 480, a middle inclined portion 482 and an outer declined portion 484. When a substrate is positioned in the processing position, the substrate plating surface is positioned above the cylindrical opening of the container body 472. A gap for electrolyte solution flow is formed between the lower surface of the electric contact 466 and the upper surface of the weir 478. The lower surface of the electric contact 466 is disposed above the inner flat portion 480 and the middle inclined portion of the weir 478. The outer declined portion 484 is sloped downwardly to facilitate flow of the electrolyte solution into the electrolyte solution collector 440.

A lower portion of the container body 472 extends radially outwardly to form a lower annular flange 486 for securing the container body 472 to the bowl 430. The outer dimension, ie., circumference, of the annular flange 486 is smaller than the dimensions of the opening 444 and the inner circumference of the electrolyte solution collector 440. The smaller dimension of the annular flange to allow removal and replacement of the process cell 420 from the electroplating process cell 400. In one embodiment, multiple bolts 488 are fixedly disposed on the annular flange 486 and extend downwardly through matching bolt holes on the bowl 430. A plurality of removable fastener nuts 490 secure the process cell 420 onto the bowl 430. A seal 487, such as an elastomer O-ring, is disposed between container body 472 and the bowl 430 radially inwardly from the bolts 488 to prevent leaks from the process cell 420. The nuts/bolts combination facilitates fast and easy removal and replacement of the components of the process cell 420 during maintenance.

In one embodiment, the filter 476 is attached to and completely covers the lower opening of the container body 472, and the anode assembly 474 is disposed below the filter 476. A spacer 492 is disposed between the filter 476 and the anode assembly 474. In an embodiment, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430.

The anode assembly 474 in one embodiment comprises a consumable anode that serves as a metal source in the electrolyte solution. Alternatively, the anode assembly 474 comprises a non-consumable anode, and the metal to be electroplated is supplied within the electrolyte solution from the electrolyte solution replenishing system 220. As shown in FIG. 6, the anode assembly 474 is a self-enclosed module having a porous anode enclosure 494 that may be made of the same metal as the metal to be electroplated, such as copper. Alternatively, the anode enclosure 494 is made of porous materials, such as ceramics or polymeric membranes. A soluble metal 496, such as high purity copper for electrochemical plating of copper, is disposed within the anode enclosure 494. The soluble metal 496 preferably comprises metal particles, wires or a perforated sheet. The porous anode enclosure 494 also acts as a filter that keeps the particulates generated by the dissolving metal within the anode enclosure 494. As compared to a non-consumable anode, the consumable, i.e., soluble, anode provides gas-generation-free electrolyte solution and minimizes the need to constantly replenish the metal in the electrolyte solution.

An anode electrode contact 498 is inserted through the anode enclosure 494 to provide electrical connection to the soluble metal 496 from a power supply. In one embodiment, the anode electrode contact 498 is made from a conductive material that is insoluble in the electrolyte solution, such as titanium, platinum and platinum-coated stainless steel. The anode electrode contact 498 extends through the bowl 430 and is connected to an electric power supply. Preferably, the anode electric contact 498 includes a threaded portion 497 for a fastener nut 499 to secure the anode electric contact 498 to the bowl 430, and a seal 495 such as a elastomer washer, is disposed between the fastener nut 499 and the bowl 430 to prevent leaks from the process cell 420.

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. Bolts 488 are inserted through the holes 508, and the fastener nuts 490 are fastened onto the bolts 488 that secure the upper annular flange 506 of the bowl 430 to the lower annular flange 486 of the container body 472. In one embodiment, the outer dimension, i.e., circumference, of the upper annular flange 506 is about the same as the outer dimension, i.e., circumference, of the lower annular flange 486. Preferably, the lower surface of the upper annular flange 506 of the bowl 430 rests on a support flange of the mainframe 214 when the process cell 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502. These relative dimensions force a substantial portion of the electrolyte solution to flow through the anode assembly 474 first before flowing through the filter 476. The bottom portion 504 of the bowl 430 includes an electrolyte solution inlet 510 that connects to an electrolyte solution supply line from the electrolyte solution replenishing system 220. In one embodiment, the anode assembly 474 is disposed about a middle portion of the cylindrical portion 502 of the bowl 430. The anode assembly 474 is configured to provide a gap for electrolyte solution flow between the anode assembly 474 and the electrolyte solution inlet 510 on the bottom portion 504.

The electrolyte solution inlet 510 and the electrolyte solution supply line are connected by a releasable connector that facilitates easy removal and replacement of the process cell 420. When the process cell 420 needs maintenance, the electrolyte solution is drained from the process cell 420, and the electrolyte solution flow in the electrolyte solution supply line is discontinued and drained. The connector for the electrolyte solution supply line is released from the electrolyte solution inlet 510, and the electric connection to the anode assembly 474 is also disconnected. The head assembly 410 is raised or rotated to provide clearance for removal of the process cell 420. The process cell 420 is then removed from the mainframe 214, and a new or reconditioned process cell is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

Figure 20:
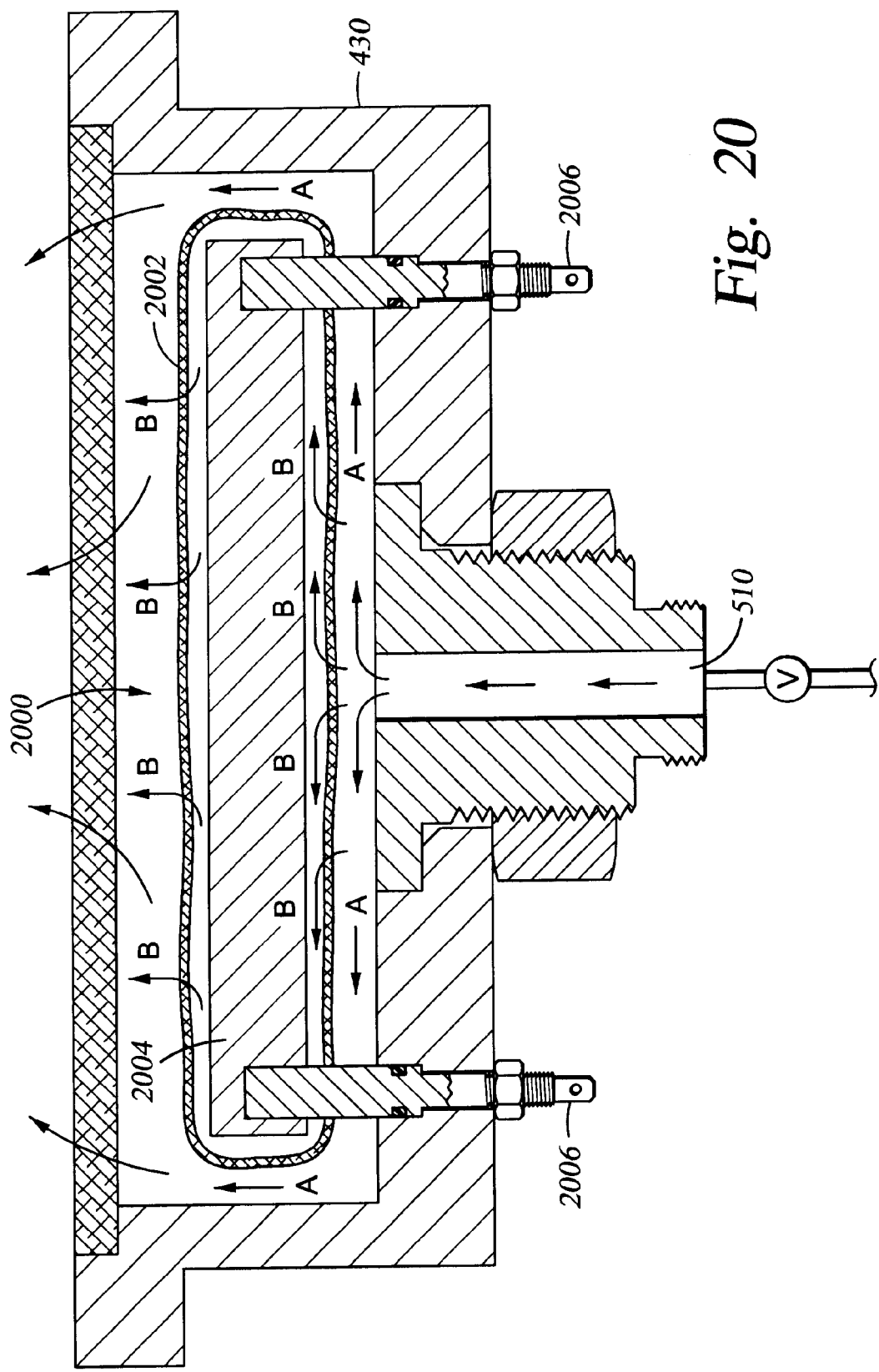
FIG. 20 is a cross sectional view of one embodiment of an encapsulated anode that can be used in the process cell shown in FIG. 6.

FIG. 20 is a cross sectional view of one embodiment of an encapsulated anode. The encapsulated anode 2000 includes a permeable anode enclosure that filters or traps "anode sludge" or particulates generated as the metal is dissolved from the anode plate 2004. As shown in FIG. 20, the anode plate 2004 comprises a solid piece of copper. In one embodiment, the anode plate 2004 is a high purity, oxygen free copper, enclosed in a hydrophilic anode encapsulation membrane 2002. The anode plate 2004 is secured and supported by a plurality of electric contacts or feed-throughs 2006 that extend through the bottom of the bowl 430. The electric contacts or feed-throughs 2006 extend through the anode encapsulation membrane 2002 into the bottom surface of the anode plate 2004. The flow of the electrolyte solution, as indicated by the arrow A, from the electrolyte solution inlet 510 disposed at the bottom of the bowl 430 through the gap between the anode and the bowl sidewall. The electrolyte solution also flows through the anode encapsulation membrane 2002 by permeation into and out of the gap between the anode encapsulation membrane and the anode plate, as indicated by the arrow B. In one embodiment, the anode encapsulation membrane 2002 comprises a hydrophilic porous membrane, such as a modified polyvinyllidene fluoride membrane, having porosity between about 60% and 80%, more preferably about 70%, and pore sizes between about 0.025 $\mu$m and about 1 $\mu$m, more preferably between about 0.1 $\mu$m and about 0.2 $\mu$m. One example of a hydrophilic porous membrane is the Durapore Hydrophilic Membrane, available from Millipore Corporation, located in Bedford, Mass. As the electrolyte solution flows through the encapsulation membrane, anode sludge and particulates generated by the dissolving anode are filtered or trapped by the encapsulation membrane. Thus, the encapsulation membranes improve the purity of the electrolyte solution during the electroplating process, and defect formations on the substrate during the electroplating process caused by anode sludge and contaminant particulates are significantly reduced.

Figure 21:
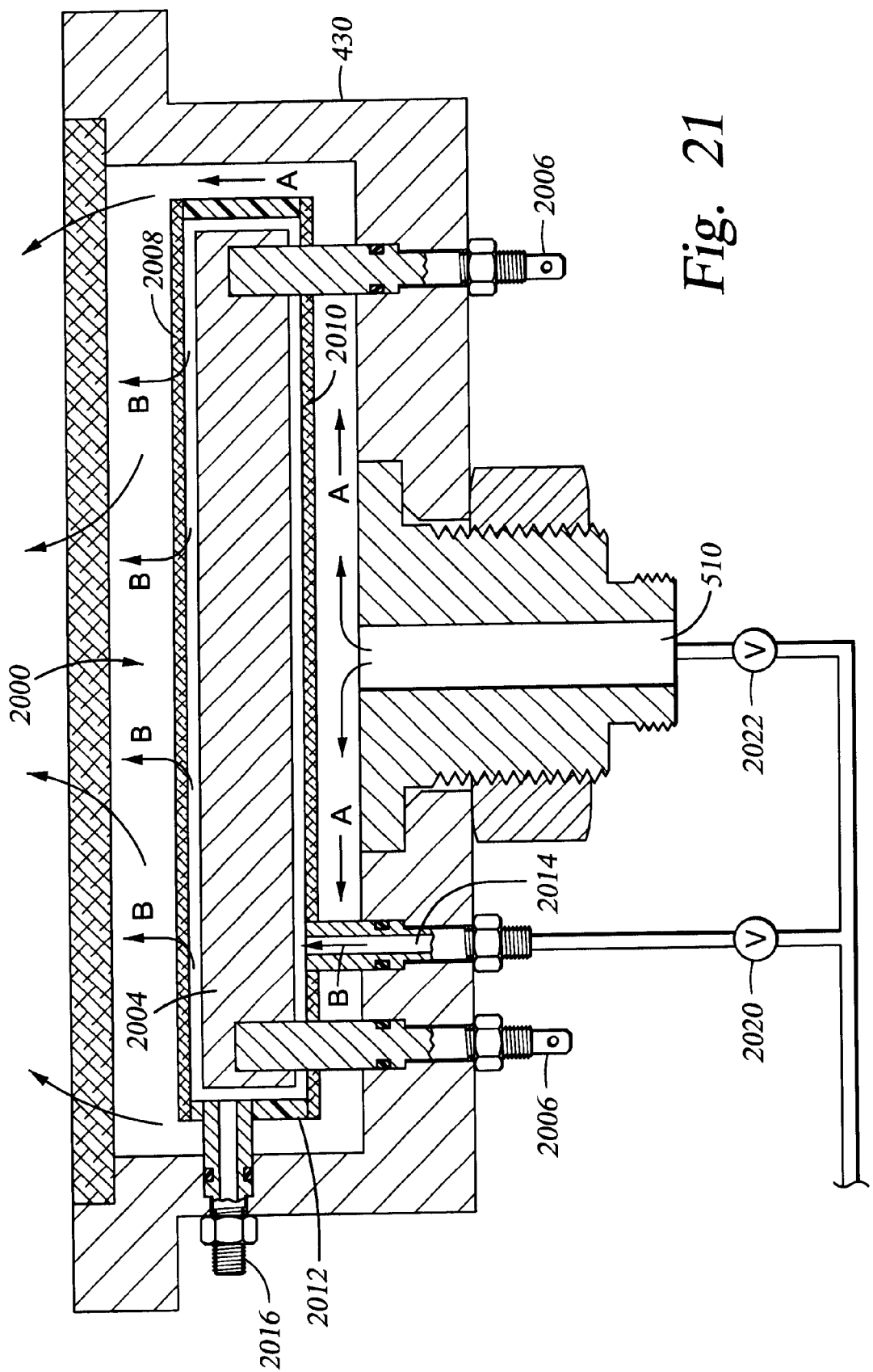
FIG. 21 is a cross sectional view of another embodiment of an encapsulated anode that can be used in the process cell shown in FIG. 6.

FIG. 21 is a cross sectional view of another embodiment of an encapsulated anode. The anode plate 2004 is secured and supported on the electric feed-throughs 2006. A top encapsulation membrane 2008 and a bottom encapsulation membrane 2010, disposed respectively above and below the anode plate 2004, are attached to a membrane support ring 2012 that is disposed around the anode plate 2004. The top and bottom encapsulation membranes 2008, 2010 comprise a material from the list above. The membrane support ring 2012 comprises a relatively rigid material as compared to the encapsulation membrane, such as plastic or other polymers. A bypass fluid inlet 2014 is disposed through the bottom of the bowl 430 and through the bottom encapsulation membrane 2010 to introduce electrolyte solution into the gap between the encapsulation membranes and the anode plate. A bypass outlet 2016 is connected to the membrane support ring 2012 and extends through the bowl 430 to facilitate flow of excess electrolyte solution with the anode sludge or generated particulates out of the encapsulated anode into a waste drain, not shown.

In one embodiment, the flow of the electrolyte solution within the bypass fluid inlet 2014 and the main electrolyte solution inlet 510 are individually controlled by flow control valves 2020, 2022. The individual flow control valves 2020, 2022 are respectively placed along the fluid lines connected to the inlets. The fluid pressure in the bypass fluid inlet 2014 is maintained at a higher pressure than the pressure in the main electrolyte solution inlet 510. The flow of the electrolyte solution inside the bowl 430 from the main electrolyte solution inlet 510 is indicated by arrows A, and the flow of the electrolyte solution inside the encapsulated anode 2000 is indicated by the arrows B. A portion of the electrolyte solution introduced into the encapsulated anode flows out of the encapsulated anode through the bypass outlet 2016. By providing a dedicated bypass electrolyte solution supply into the encapsulated anode, the anode sludge or particulates generated from the dissolving anode is continually removed from the anode, thereby improving the purity of the electrolyte solution during the electroplating process.

Figure 22:
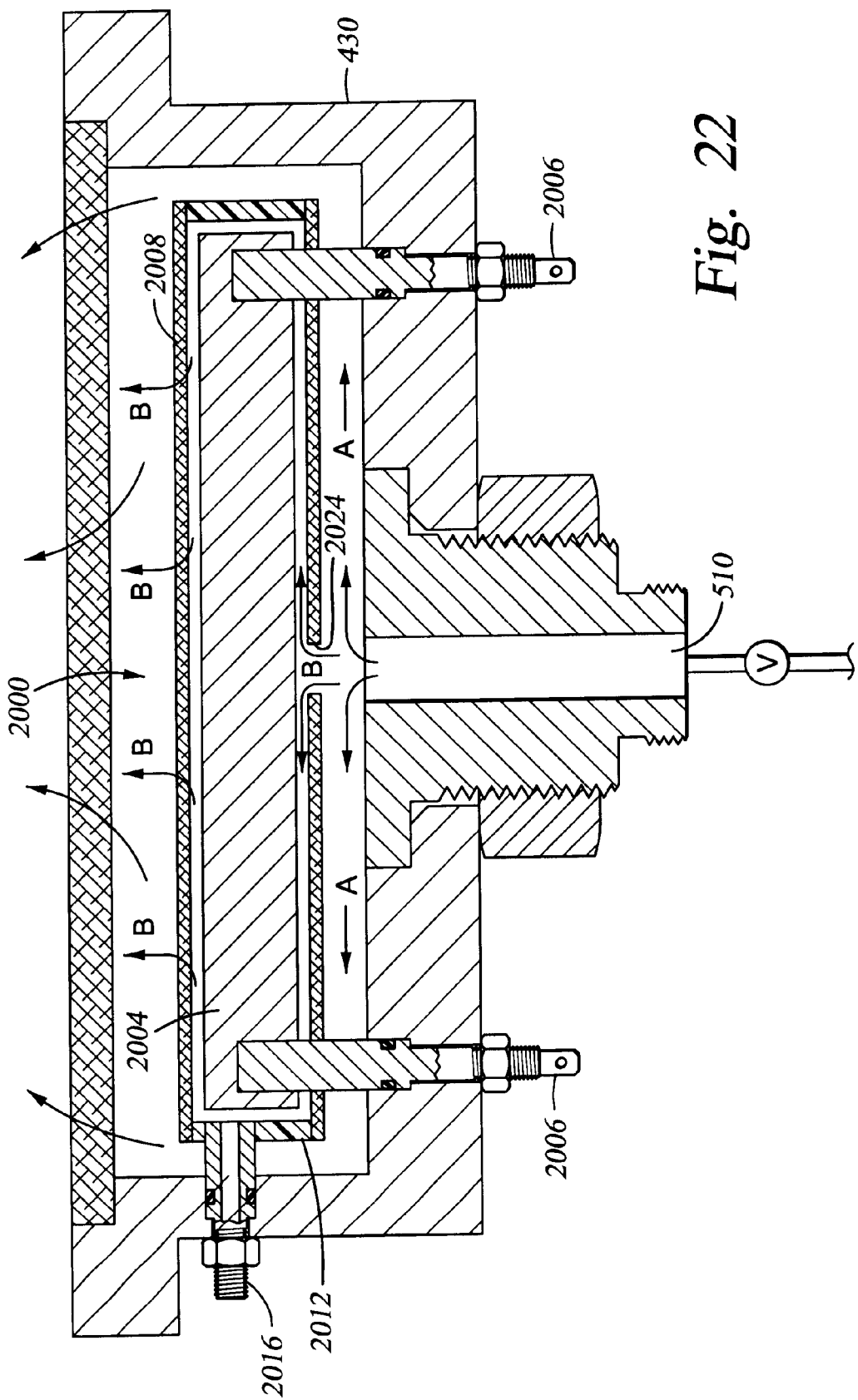
FIG. 22 is a cross sectional view of yet another embodiment of an encapsulated anode that can be used in the process cell shown in FIG. 6.

FIG. 22 is a cross sectional view of yet another embodiment of an encapsulated anode. This embodiment of an encapsulated anode 2000 includes an anode plate 2004, a plurality of electric feed-throughs 2006, a top encapsulation membrane 2008, a bottom encapsulation membrane 2010, a membrane support ring 2012, and a bypass outlet 2016. The anode plate 2004 is secured and supported on the plurality of electric feed-throughs 2006. The top and a bottom encapsulation membrane 2008, 2010 are attached to a membrane support ring 2012. The bypass outlet 2016 is connected to the membrane support ring 2012 and extends through the bowl 430. This embodiment of an encapsulated anode preferably comprises materials as described above for the previous-described embodiments of an encapsulated anode. The bottom encapsulation membrane 2010 includes one or more openings 2024 disposed substantially above the main electrolyte solution inlet 510. Each opening 2024 is adapted to receive flow of electrolyte solution from the main electrolyte solution inlet 510 and is preferably about the same size as the internal circumference of the main electrolyte solution inlet 510. The flow of the electrolyte solution from the main electrolyte solution inlet 510, indicated by the arrow A, and the flow of the electrolyte solution within the encapsulated anode, indicated by the arrow B. A portion of the electrolyte solution flows out of the encapsulated anode through the bypass outlet 2016, carrying a portion of the anode sludge and particulates generated from anode dissolution.

Figure 23:
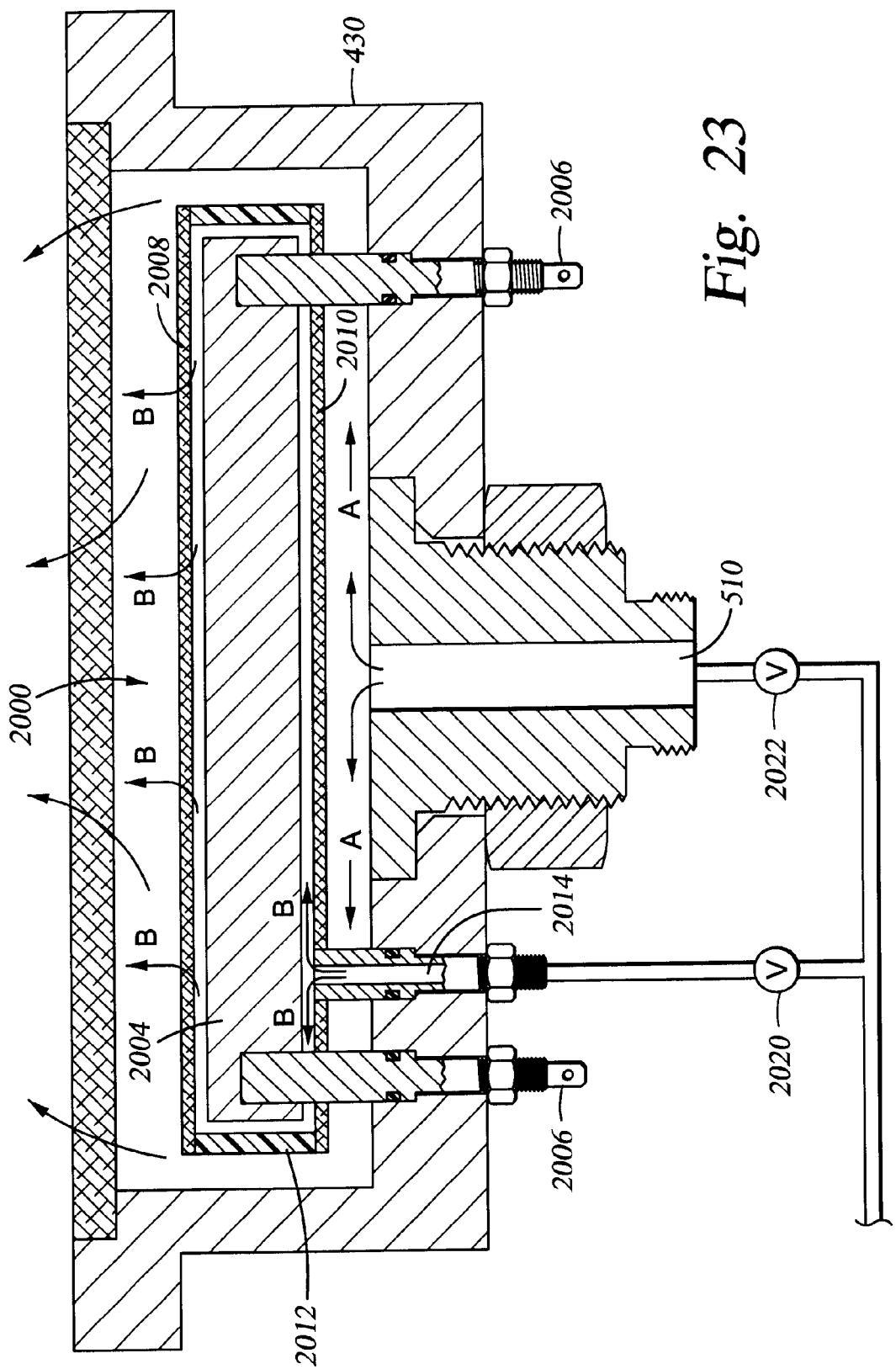
FIG. 23 is a cross sectional view of another embodiment of an encapsulated anode that can be used in the process cell shown in FIG. 6.

FIG. 23 is a cross sectional view of another embodiment of an encapsulated anode. This embodiment of an encapsulated anode 2000 includes an anode plate 2002, a plurality of electric feed-throughs 2006, a top encapsulation membrane 2008, a bottom encapsulation membrane 2010, a membrane support ring 2012, and a bypass fluid inlet 2014. The anode plate 2002 is secured and supported on a plurality of electric feed-throughs 2006. The top and bottom encapsulation membranes 2008, 2010 are attached to a membrane support ring 2012. A bypass fluid inlet 2014 is disposed through the bottom of the bowl 430 and through the bottom encapsulation membrane 2010 to introduce electrolyte solution into the gap between the encapsulation membranes and the anode plate. This embodiment of an encapsulated anode comprises materials as described above for the above-described embodiments of an encapsulated anode. In one embodiment, the flow of the electrolyte solution through the bypass fluid inlet 2014 and the main electrolyte solution inlet 510 are individually controlled by control valves 2020, 2022, respectively. The flow of the electrolyte solution from the main electrolyte solution inlet 510 is indicated by the arrows A while the flow of the electrolyte solution through the encapsulated anode is indicated by arrows B. For this embodiment, the anode sludge and particulates generated by the dissolving anode plate are filtered and trapped by the encapsulation membranes as the electrolyte solution passes through the membrane.

Figure 16:
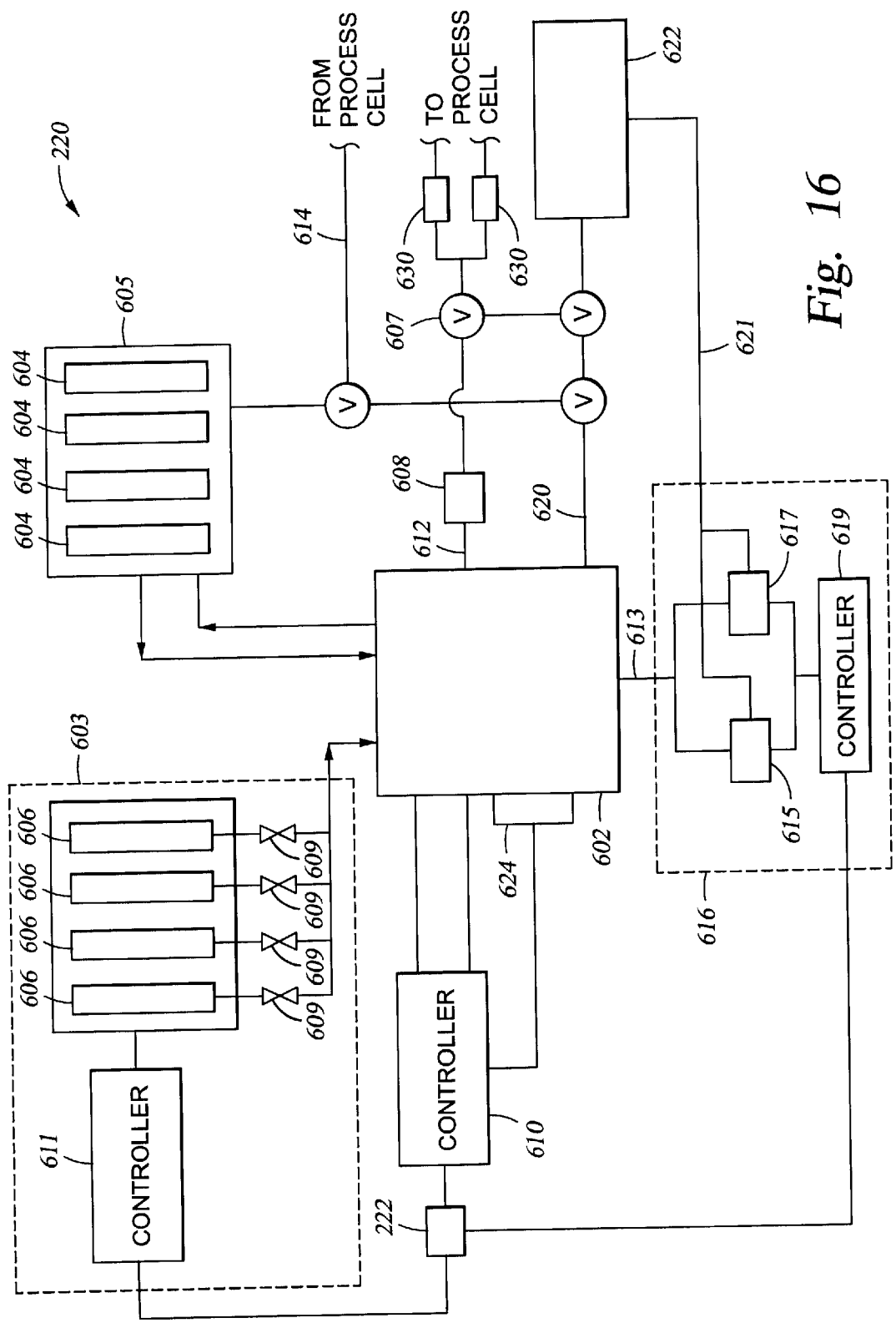
FIG. 16 is a schematic diagram of one embodiment of an electrolyte solution replenishing system.

FIG. 16 is a schematic diagram of an electrolyte solution replenishing system 220. The electrolyte solution replenishing system 220 provides the electrolyte solution to the electroplating process cells for the electroplating process. The electrolyte solution replenishing system 220 generally comprises a main electrolyte solution tank 602, a dosing module 603, a filtration module 605, a chemical analyzer module 616, and an electrolyte solution waste disposal system 622. The electrolyte solution waste disposal system 622 is connected to the analyzing module 616 by an electrolyte solution waste drain 620. One or more controllers control the chemical composition of the electrolyte solution in the main tank 602 and the related operation of the electrolyte solution replenishing system 220. In one embodiment, the controllers are independently operable but integrated with the controller 222 of the ECP system 200.

The main electrolyte solution tank 602 provides a reservoir for electrolyte solution and includes an electrolyte solution supply line 612 that is connected to each of the electroplating process cells through one or more fluid pumps 608 and valves 607. A heat exchanger 624 or a heater/chiller disposed in thermal connection with the main tank 602 controls the temperature of the electrolyte solution stored in the main tank 602. The heat exchanger 624 is connected to and operated by the controller 610.

The dosing module 603 is connected to the main tank 602 by a supply line and includes a plurality of source tanks 606, or feed bottles, a plurality of valves 609, and a controller 611. The source tanks 606 contain the chemicals needed for composing the electrolyte solution and typically include a deionized water source tank and copper sulfate ($CuSO_4$) source tank for composing the electrolyte solution. Other source tanks 606 may contain hydrogen sulfate ($H_2SO_4$), hydrogen chloride (HCl) and various additives such as glycol. Each source tank may be color coded and fitted with a unique mating outlet connector adapted to connect to a matching inlet connector in the dosing module. By color coding the source tanks and fitting the source tanks with unique connectors, errors caused by human operators when exchanging or replacing the source tanks are significantly reduced.

The deionized water source tank preferably also provides deionized water to the system for cleaning the system during maintenance. The valves 609 associated with each source tank 606 regulate the flow of chemicals to the main tank 602 and may be any of numerous commercially available valves such as butterfly valves, throttle valves and the like. Activation of the valves 609 is accomplished by the controller 611 which may be connected to the controller 222 to receive signals therefrom.

The electrolyte solution filtration module 605 includes a plurality of filter tanks 604. An electrolyte solution return line 614 is connected between each of the process cells and one or more filter tanks 604. The filter tanks 604 remove the undesired contents in the used electrolyte solution before returning the electrolyte solution to the main tank 602 for re-use. The main tank 602 is also connected to the filter tanks 604 to facilitate re-circulation and filtration of the electrolyte solution in the main tank 602. By re-circulating the electrolyte solution from the main tank 602 through the filter tanks 604, the undesired contents in the electrolyte solution are continuously removed by the filter tanks 604 to maintain a consistent level of purity. Additionally, re-circulating the electrolyte solution between the main tank 602 and the filtration module 605 allows the various chemicals in the electrolyte solution to be thoroughly mixed.

The electrolyte solution replenishing system 220 also includes a chemical analyzer module 616 that provides real-time chemical analysis of the chemical composition of the electrolyte solution. The analyzer module 616 is fluidly coupled to the main tank 602 by a sample line 613 and to the waste disposal system 622 by an outlet line 621. The analyzer module 616 generally comprises at least one analyzer and a controller to operate the analyzer. The number of analyzers required for a particular processing tool depends on the composition of the electrolyte solution. For example, while a first analyzer may be used to monitor the concentrations of organic substances, a second analyzer is needed for inorganic chemicals. In the specific embodiment shown in FIG. 16 the chemical analyzer module 616 comprises an auto titration analyzer 615 and a cyclic voltametric stripper (CVS) 617. Both analyzers are commercially available from various suppliers. An auto titration analyzer which may be used to advantage is available from Parker Systems and a cyclic voltametric stripper is available from ECI. The auto titration analyzer 615 determines the concentrations of inorganic substances such as copper chloride and acid. The CVS 617 determines the concentrations of organic substances such as the various additives which may be used in the electrolyte solution and by-products resulting from the processing which are returned to the main tank 602 from the process cells.

The analyzer module shown FIG. 16 is merely illustrative. In another embodiment each analyzer may be coupled to the main electrolyte solution tank by a separate supply line and be operated by separate controllers. Persons skilled in the art will recognize other embodiments.

In operation, a sample of electrolyte solution is flowed to the analyzer module 616 via the sample line 613. Although the sample may be taken periodically, preferably a continuous flow of electrolyte solution is maintained to the analyzer module 616. A portion of the sample is delivered to the auto titration analyzer 615 and a portion is delivered to the CVS 617 for the appropriate analysis. The controller 619 initiates command signals to operate the analyzers 615, 617 in order to generate data. The information from the chemical analyzers 615, 617 is then communicated to the controller 222. The controller 222 processes the information and transmits signals that include user-defined chemical dosage parameters to the dosing controller 611. The received information is used to provide real-time adjustments to the source chemical replenishment rates by operating one or more of the valves 609. The received information thereby maintains a desired, and preferably constant, chemical composition of the electrolyte solution throughout the electroplating process. The waste electrolyte solution from the analyzer module is then flowed to the waste disposal system 622 via the outlet line 621.

Although one embodiment utilizes real-time monitoring and adjustments of the electrolyte solution, various alternatives may be employed. For example, the dosing module 603 may be controlled manually by an operator observing the output values provided by the chemical analyzer module 616. In one embodiment, the system software allows for both an automatic real-time adjustment mode as well as an operator, manual, mode. Further, although multiple controllers are shown in FIG. 16, a single controller may be used to operate various components of the system such as the chemical analyzer module 616, the dosing module 603, and the heat exchanger 624. Other embodiments will be apparent to those skilled in the art.

The electrolyte solution replenishing system 220 also includes an electrolyte solution waste drain 620 connected to an electrolyte solution waste disposal system 622 for safe disposal of used electrolyte solutions, chemicals and other fluids used in the ECP system. In one embodiment, the electroplating cells include a direct line connection to the electrolyte solution waste drain 620, or the electrolyte solution waste disposal system 622. The electrolyte solution waste drain 620 drains the electroplating cells without returning the electrolyte solution through the electrolyte solution replenishing system 220. The electrolyte solution replenishing system 220 preferably also includes a bleed off connection to bleed off excess electrolyte solution to the electrolyte solution waste drain 620.

In one embodiment, the electrolyte solution replenishing system 220 also includes one or more degasser modules 630 adapted to remove undesirable gases from the electrolyte solution. The degasser module generally comprises a membrane that separates gases from the fluid passing through the degasser module and a vacuum system for removing the released gases. The degasser modules 630 are preferably placed in line on the electrolyte solution supply line 612 adjacent to the process cells 240. The degasser modules 630 are preferably positioned as close as possible to the process cells 240 so most of the gases from the electrolyte solution replenishing system are removed by the degasser modules before the electrolyte solution enters the process cells. In one embodiment, each degasser module 630 includes two outlets to supply degassed electrolyte solution to the two process cells 240 of each processing station 218. Alternatively, a degasser module 630 is provided for each process cell. The degasser modules can be placed at many other alternative positions. For example, the degasser module can be placed at other positions in the electrolyte solution replenishing system, such as along with the filter section or in a closed-loop system with the main tank or with the process cell. As another example, one degasser module is placed in line with the electrolyte solution supply line 612 to provide degassed electrolyte solution to all of the process cells 240 of the electro-chemical plating system. Additionally, a separate degasser module is positioned in-line or in a closed-loop with the deionized water supply line and is dedicated for removing oxygen from the deionized water source. Because deionized water is used to rinse the processed substrates, free oxygen gases are preferable removed from the deionized water before reaching the SRD modules so that the electroplated copper is less likely to become oxidized by the rinsing process. Degasser modules are well known in the art and commercial embodiments are generally available and adaptable for use in a variety of applications. A commercially available degasser module is available from Millipore Corporation, located in Bedford, Mass.

Figure 26A:
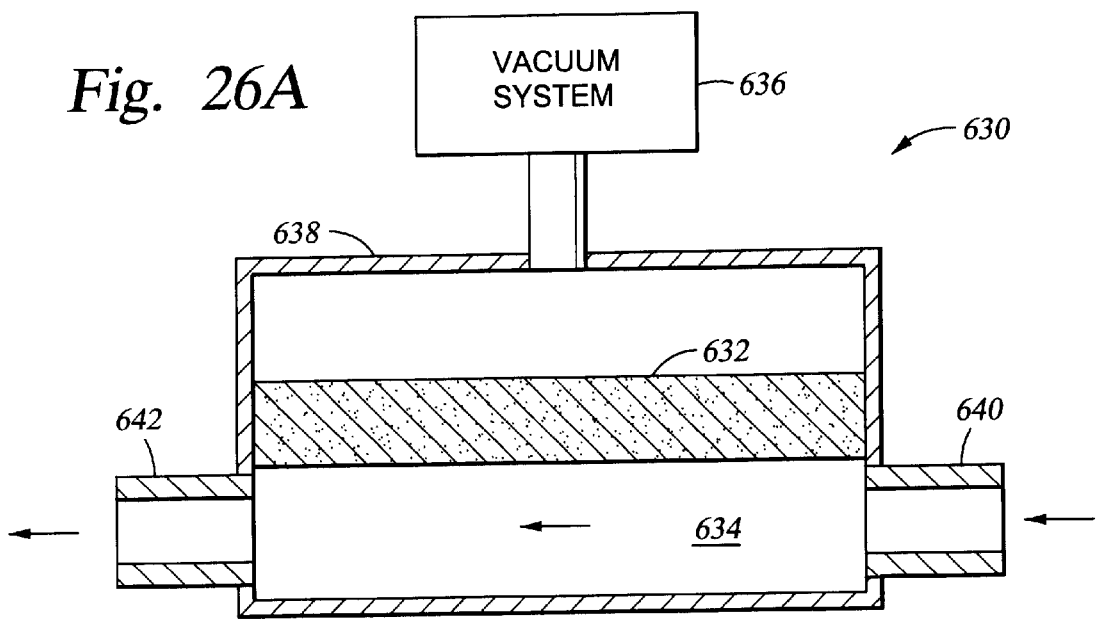
FIGS. 26a and 26b are cross sectional views of embodiments of a degasser module.
Figure 26B:
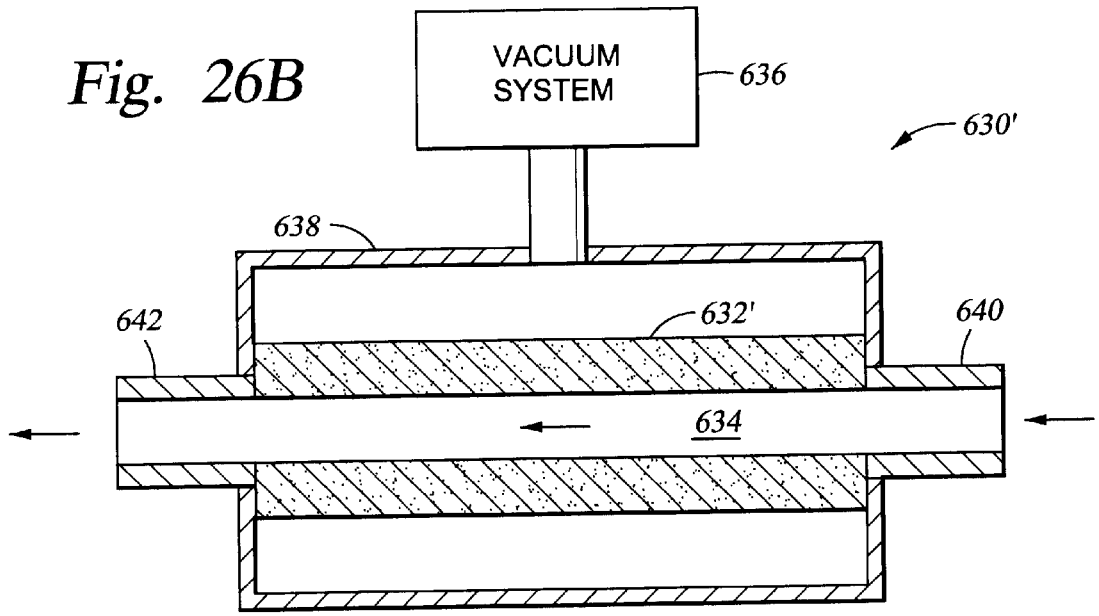

One embodiment of the degasser module 630, as shown in FIG. 26a, includes a hydrophobic membrane 632 having a fluid, i.e., electrolyte solution, passage 634 on one side of the membrane 632. A vacuum system 636 disposed on the opposite side of the membrane. The enclosure 638 of the degasser module includes an inlet 640 and one or more outlets 642. As the electrolyte solution passes through the degasser module 630, the gases and other micro-bubbles in the electrolyte solution are separated from the electrolyte solution through the hydrophobic membrane and removed by the vacuum system. Another embodiment of the degasser module 630', as shown in FIG. 26b, includes a tube of hydrophobic membrane 632' and a vacuum system 636 disposed around the tube of hydrophobic membrane 632'. The electrolyte solution is introduced inside the tube of hydrophobic membrane, and as the electrolyte solution passes through the fluid passage 634 in the tube. The hydrophobic membrane separates gases and other micro-bubbles in the electrolyte solution, and a tube that is connected to the vacuum system 636 removes the separated gasses. More complex designs of degasser modules are contemplated, including designs having serpentine paths of the electrolyte solution across the membrane and other multi-sectioned designs of degasser modules.

Although not shown in FIG. 16, the electrolyte solution replenishing system 220 may include a number of other components. For example, the electrolyte solution replenishing system 220 may also include one or more additional tanks for storage of chemicals for a substrate cleaning system, such as the SRD station. Double-contained piping for hazardous material connections may also be employed to provide safe transport of the chemicals throughout the system. Optionally, the electrolyte solution replenishing system 220 includes connections to additional or external electrolyte solution processing system to provide additional electrolyte solution supplies to the ECP system.

Figure 17:
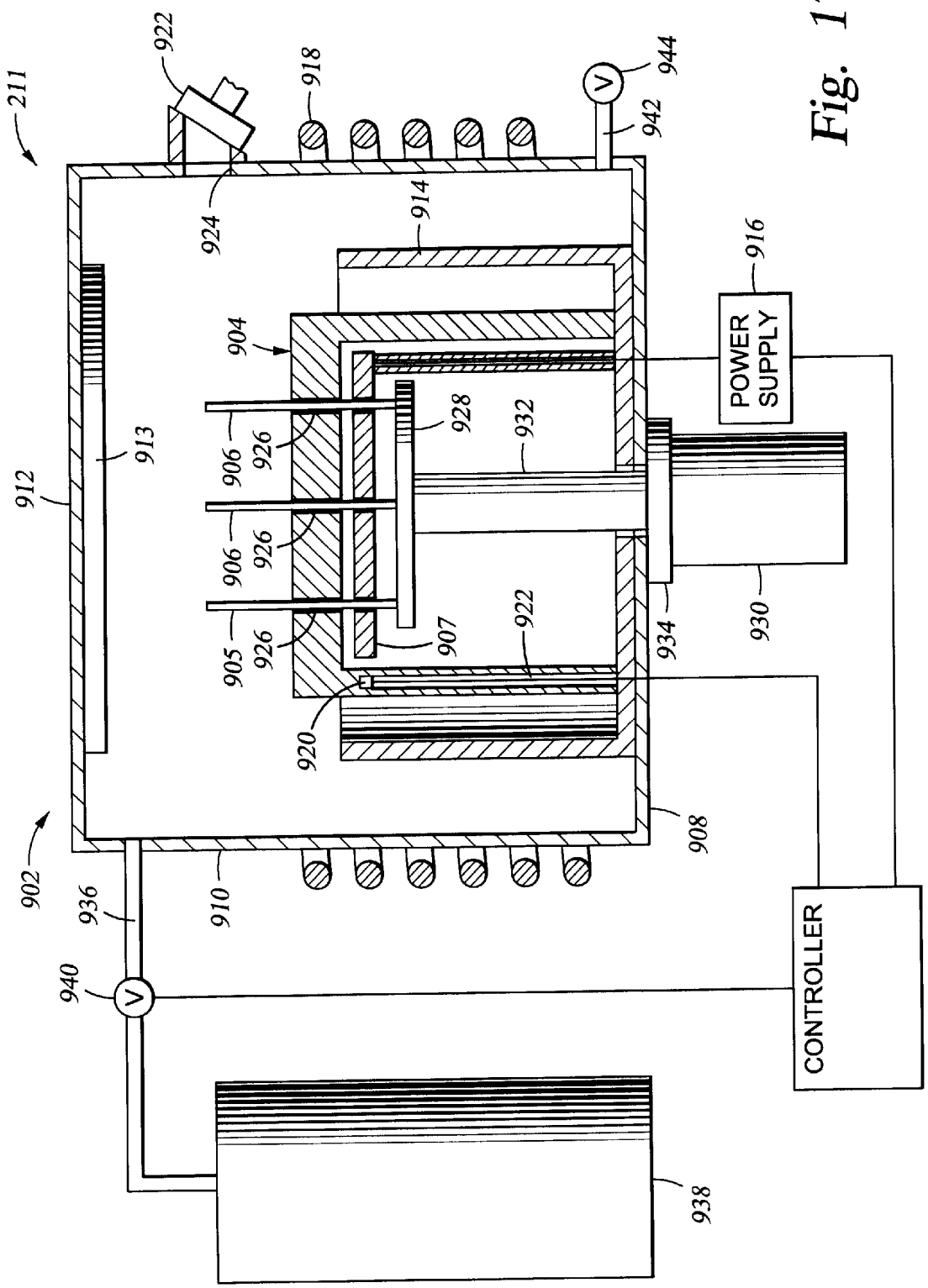
FIG. 17 is a cross sectional view of one embodiment of a rapid thermal anneal (RTA) chamber.

FIG. 17 is a cross sectional view of one embodiment of rapid thermal anneal (RTA) chamber. The RTA chamber 211 is preferably connected to the loading station 210, and substrates are transferred into and out of the RTA chamber 211 by the loading station transfer robot 228. The ECP system, as shown in FIGS. 2 and 3, comprises two RTA chambers 211 disposed on opposing sides of the loading station 210, corresponding to the symmetric design of the loading station 210. RTA chambers are generally well known in the art, and RTA chambers are typically utilized in substrate processing systems to enhance the properties of the deposited materials. A variety of RTA chamber designs, including hot plate designs and heat lamp designs, may be used to enhance the electroplating results. One RTA chamber is the WxZ chamber available from Applied materials, Inc., located in Santa Clara, Calif. Although this disclosure is described using a hot plate RTA chamber, other types of RTA chambers may be used as well.

Referring back to FIG. 2, the ECP system 200 includes a controller 222 that controls the functions of each component of the platform. In one embodiment, the controller 222 is mounted above the mainframe 214, and the controller comprises a programmable microprocessor. The programmable microprocessor is typically programmed using a software designed specifically for controlling all components of the ECP system 200. The controller 222 also provides electric power to the components of the system and includes a control panel 223 that allows an operator to monitor and operate the ECP system 200. The control panel 223, as shown in FIG. 2, is a stand-alone module that is connected to the controller 222 through a cable and provides easy access to an operator. Generally, the controller 222 coordinates the operations of the loading station 210, the RTA chamber 211, the SRD station 212, the mainframe 214 and the processing stations 218. Additionally, the controller 222 coordinates with the controller of the electrolyte solution replenishing system 220 to provide the electrolyte solution for the electroplating process.

The following is a description of one embodiment of a substrate electroplating process sequence through the electroplating system platform 200 as shown in FIG. 2. A substrate cassette containing a plurality of substrates is loaded into the substrate cassette receiving areas 224 in the loading station 210 of the electroplating system platform 200. A loading station transfer robot 228 picks up a substrate from a substrate slot in the substrate cassette and places the substrate in the substrate orientor 230. The substrate orientor 230 determines and orients the substrate to a desired orientation for processing through the system. The loading station transfer robot 228 then transfers the oriented substrate from the substrate orientor 230 and positions the substrate in one of the substrate slots in the substrate pass-through cassette 238 in the SRD station 212. The mainframe transfer robot 242 picks up the substrate from the substrate pass-through cassette 238 and positions the substrate for transfer by the flipper robot 248. The flipper robot 248 rotates its robot blade below the substrate and picks up substrate from mainframe transfer robot blade. The vacuum suction gripper on the flipper robot blade secures the substrate on the flipper robot blade, and the flipper robot flips the substrate from a face up position to a face down position. The flipper robot 248 rotates and positions the substrate face down in the substrate holder assembly 450. The substrate is positioned below the substrate holder plate 464 but above the cathode contact ring 466. The flipper robot 248 then releases the substrate to position the substrate into the cathode contact ring 466. The substrate holder plate 464 moves toward the substrate and the vacuum chuck secures the substrate on the substrate holder plate 464. The bladder assembly 470 on the substrate holder assembly 450 exerts pressure against the substrate backside to ensure electric contact between the substrate plating surface and the cathode contact ring 466.

To limit deposition of metal film on the electric contacts, a negative bias is applied by the power supply 702 (shown in FIG. 11) under the control of the controller 222. The head assembly 452 is lowered to a processing position above the process cell 420. The negative bias voltage can then be applied to the electric contacts. The duration at which the negative bias voltage is applied to the electric contacts is shorter than a duration that would dry the electrolyte solution to form chemical (.e.g., copper sulfate) crystals on the electric contacts. As such, the duration at which the negative bias voltage may be applied to the electric contacts before immersion of the electric contacts and the substrate into the electrolyte solution is dependent on such factors as the particular chemical make-up of the electrolyte solution, and the drying conditions that the electric contacts are exposed to prior to immersion. During the immersion of the electric contacts into the electrolyte solution, however, a slight negative (depating) or neutral bias voltage is applied between the anode and the seed layer to ensure that the metal ions do not deposit on the electric contacts, maintaining the electric contacts in a pristine condition. The level of the slight negative or neutral bias voltage is selected to be insufficient to cause considerable deplating of the seed layer, or deposited metal film, on the substrate. At this position the substrate is below the upper plane of the weir 478 and contacts the electrolyte solution contained in the process cell 420. The power supply is activated to supply electric power, i.e., voltage and current, to the cathode and the anode to enable the electroplating process. The electrolyte solution is typically continually pumped into the process cell during the electroplating process. The electric power supplied to the cathode and the anode and the flow of the electrolyte solution are controlled by the controller 222 to achieve the desired electroplating results. In one embodiment, the head assembly is rotated as the head assembly is lowered and also during the electroplating process.

After the electroplating process is completed, the head assembly 410 raises the substrate holder assembly and removes the substrate from the electrolyte solution. During removal of the substrate from the electrolyte solution, a slight negative (deplating) or neutral voltage is applied between the anode and the electric contacts to limit metal film deposition on the electric contacts. The level of the slight negative or neutral voltage is insufficient to cause deplating of the seed layer on the substrate. The exact level of the slight negative or neutral voltage is dependent upon the chemical make-up of the electrolyte solution. In one embodiment, the head assembly is spun for a period of time at a sufficient angular velocity such as between about 50 to about 3000 RPM, to enhance removal of residual electrolyte solution from the substrate and the substrate holder assembly. The vacuum chuck and the bladder assembly of the substrate holder assembly then release the substrate from the substrate holder plate. The substrate holder assembly is raised to allow the flipper robot blade to pick up the processed substrate from the cathode contact ring. The flipper robot rotates the flipper robot blade above the backside of the processed substrate in the cathode contact ring and picks up the substrate using the vacuum suction gripper on the flipper robot blade. The flipper robot rotates the flipper robot blade with the substrate out of the substrate holder assembly, flips the substrate from a face-down position to a face-up position, and positions the substrate on the mainframe transfer robot blade. The mainframe transfer robot then transfers and positions the processed substrate above the SRD module 236. The SRD substrate support lifts the substrate, and the mainframe transfer robot blade retracts away from the SRD module 236. The substrate is cleaned in the SRD module using deionized water or a combination of deionized water and a cleaning fluid as described in detail above. The substrate is then positioned for transfer out of the SRD module. The loading station transfer robot 228 picks up the substrate from the SRD module 236 and transfers the processed substrate into the RTA chamber 211 for an anneal treatment process to enhance the properties of the deposited materials. The annealed substrate is then transferred out of the RTA chamber 211 by the loading station robot 228 and placed back into the substrate cassette for removal from the ECP system. The above-described sequence can be carried out for a plurality of substrates substantially simultaneously in the ECP system 200. Also, the ECP system can be adapted to provide multi-stack substrate processing.

2. Voltage Levels Between the Anode and the Seed Layer

The above describes an ECP system that is used to electroplate substrates. One concern during electroplating is to make the depth of metal film deposited across the substrate seed layer uniform. Metal film deposition can occur on the seed layer during the time that the substrate is being immersed in, or is being removed from the electrolyte solution. Most of the metal film deposition occurs when the seed layer on the substrate is fully immersed in the electrolyte solution. To ensure the uniformity of metal film deposition rate across the substrate seed layer, it is important to ensure that the electric current density applied to the seed layer is uniform across the face of the substrate. One aspect of the ECP system that increases the uniformity of electric current density applied to the substrate seed layer is ensuring that each one of the plurality of electric contacts remains consistently pristine. A method of modulating the power supply is described herein so that the electric contacts are maintained in a pristine state substantially free of metal film deposition, oxidation, or the chemical crystals that can occur when the power supply is off. Additionally, the modulation of the power supply enhances uniform deposition of the metal film on the seed layer.

Figure 27:
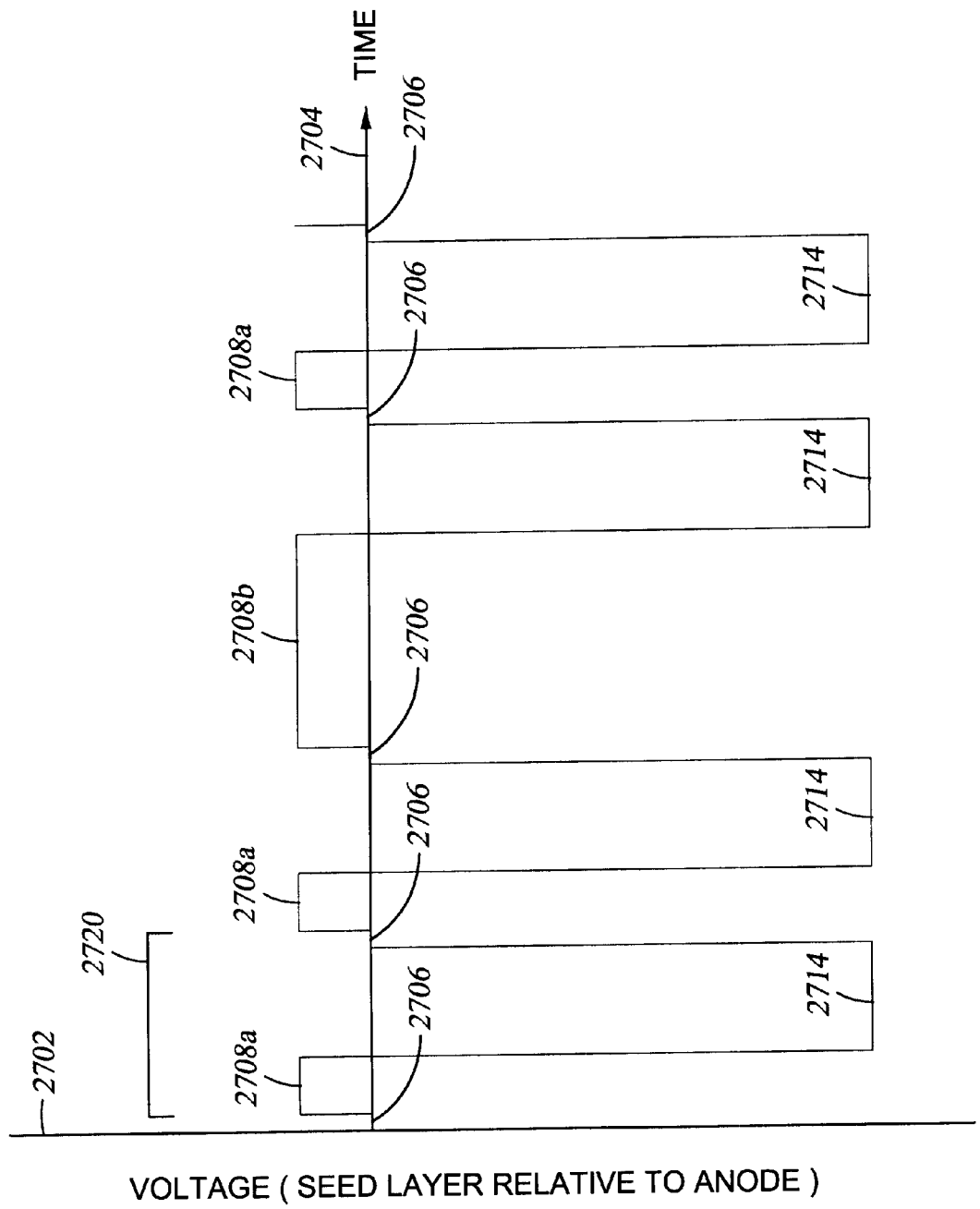
FIG. 27 shows a graph of voltage as the ordinate plotted as a function of time plotted as the abscissa for an exemplary metal film deposition process using the substrate holder system shown in FIG. 25.

The controller 222 controls the level of voltage/current applied between the anode and the seed layer on the substrate that is produced by a power supply. For plating consideration, the voltage level of the seed layer is considered relative to the anode through the electrolyte solution. FIG. 27 shows one embodiment of plating process depicted by a graph 2700 with voltage plotted as the ordinate 2702 versus time plotted as the abscissa 2704 during the plating process. Any voltage level above the level of the abscissa 2704 indicates a positive voltage of the substrate seed layer relative to the anode, i.e., an anodic seed layer and a cathodic anode. Any voltage level below the abscissa 2704 indicates a negative voltage level of the seed layer relative to the anode, i.e., a cathodic substrate seed layer and an anodic anode. A reverse bias voltage exists where the voltage of the substrate seed layer is greater than the voltage level of the anode. Therefore, a reverse bias voltage represents a reverse polarity between the anode and the seed layer as compared to the polarity of a plating voltage. During etching portions of the plating process, greater reverse bias typically results in a greater etch rate of the substrate seed layer.

Reference character 2720 represents one plating voltage cycle for a given substrate within an electrolyte cell during the plating process. Each plating voltage cycle 2720 includes a reverse bias voltage, also known as a metal film etch portion 2708, indicated as 2708a or 2708b, and a plating voltage, i.e., metal film deposition, portion 2714. The plating voltage portion 2714 represents the voltage level when a plating voltage is applied between the anode and the substrate seed layer. During the plating voltage portion 2714, the metal ions in the electrolyte solution are deposited on the substrate seed layer to form a metal film. The duration of the plating voltage portion is a function of the chemical make-up of the electrolyte solution, the metal being used in the ECP process, the desired thickness of the metal film deposited on the seed layer, and other such factors. The duration of the plating voltage portion may range from about 10 seconds to several minutes or more depending upon the chemical make-up of the electrolyte solution, i.e., the recipe used during the ECP process. The voltage level of the plating voltage portion 2714 may range from a fraction of a volt to 10 or more volts.

The reverse bias voltage 2708 is applied as the substrate is being immersed into, or withdrawn from, the electrolyte solution. The reverse bias voltage also exists between plating cycles such as when there is a temporary production downtime. Such downtime exists when no more substrates are being processed in the ECP system for some prescribed duration, .e.g., five minutes or longer. During such ECP system downtime, it is common to immerse the substrate holder assembly, including the electric contacts, in the electrolyte solution contained in the electrolyte cell. Such immersion of the electric contacts limit evaporation of the electrolyte solution on the electric contacts that would otherwise form as chemical, .e.g., copper sulfate, crystals. Voltage level 2708a represents that portion of the reverse bias voltage that is applied during a metal film etch plating voltage cycle 2720 when substrates are being immersed into, or removed from, the electrolyte solution. Such reverse bias voltage, e.g., metal film etch, portions of the cycle are applied typically for a relatively brief duration of time, typically less than 30 seconds. During the time that the reverse bias voltage portion 2708 of each cycle is being applied: a) a first substrate is removed from the electroplating cell, b) a robot removes the first substrate from the substrate holder assembly, c) a robot inserts a second substrate into the substrate holder assembly, and d) the substrate holder system 14 immerses the second substrate into the electroplating process cell. It is common for each substrate to undergo multiple plating cycles intermixed with multiple etching or cleaning cycles ECP processing. The voltage level of the reverse bias voltage 2708a may vary as a function of the dimensions of the electrolyte cell, the composition of the electrolyte solution, the metal film, and the seed layer, etc. The substrate seed layer is typically biased anodically relative to the anode by, e.g., about a fraction of a volt to about 4 volts during when voltage level 2708a is applied.

The reverse bias voltage portion 2708b is applied between the anode and the seed layer for an extended duration when substrates are not being processed. Such lack of processing down time may extend from a fraction of a minute to a day or more when no substrates are being plated. In this disclosure, the term "down time" is applied to these extended periods no substrates are being processed by the ECP system. To provide a consistent electric current density across the face of the substrate during metal film deposition on the substrate, it is important to ensure that the electric contacts are pristine. In this disclosure, the term "pristine" means that the electric contacts are substantially free of electroplated metal deposits and/or dried chemical crystals during ECP processing. During extended down-time periods when no substrate is in the substrate holder, the substrate holder assembly is positioned so all of the electric contacts are immersed in the electrolyte solution. This immersion during down time limits an oxidation reaction that results when the electric contacts are exposed to the oxygen present in the atmosphere. The voltage level that has to be applied to the anode and the seed layer during the reverse bias portion 2708b is a function of the dimensions of the electrolyte cell, the chemical composition of the electrolyte solution and/or the seed layer, etc. However, a typical voltage level of the reverse bias portion 2708b for copper electroplating has the contact elements biased anodically relative to the anode by about a fraction of a volt to about 4 volts.

When the substrate is being prepared to be immersed into the electrolyte solution after the extended reverse bias voltage portion 2708b, the substrate seed layer continues to be reverse biased by having positive voltage 2708, relative to the anode as a time extension of the reverse bias voltage portion 2708*b* during the immersion. This reverse bias 2708*b* during immersion serves a similar function as the reverse bias voltage of 2708*a*. The substrate holder assembly then immerses the seed layer into the electrolyte solution until the seed layer is fully immersed in the electrolyte solution. A closed electric circuit is created between the anode and the seed layer as the substrate is being immersed. The electric current is a function of the voltage between the anode and the seed layer and the amount that the seed layer that has been immersed. The reverse-bias voltage 2708*b* is maintained until the substrate has been fully immersed into the electrolyte solution at 2710, then the anode and the seed layer are switched to a normal bias voltage as shown by 2714.

The substrate generally is immersed in a horizontal orientation into the electrolyte solution with the seed layer facing down. In certain embodiments, the substrate may be tilted from horizontal within the substrate holder assembly during immersion. Such tilting provides for removal of air or air bubbles that may otherwise be trapped within the electrolyte solution underneath portions of the substrate holder assembly and/or substrate, during the immersion process. Closely following the full immersion of the substrate seed layer, the voltage between the anode and the seed layer is changed from a positive (reverse bias) voltage to a negative (normal bias) voltage. The negative normal bias voltage of the anode relative to the seed layer, via the electrolyte solution, is sufficient to cause metal ions in the electrolyte solution to deposit metal film on the seed layer. Such a negative normal bias voltage of the anode relative to the seed layer is known as "plating voltage". The plating voltage typically follows a plating recipe that is a function of the chemicals in the electrolyte solution, the dimensions of the substrate and the anode, etc.

The reverse bias voltage 2708*a* limits metal ions being deposited as metal film on the substrate seed layer. During the immersion of the substrate into the electrolyte solution, the reverse bias voltage 2708*a* is applied to limit certain portions of the seed layer from being coated more heavily by metal film than other seed layer portions. Such irregular coating may result from, e.g., irregular electrolyte solution flow about the substrate seed layer during immersion of and/or removal of the substrate at an angle from horizontal. As such, the reverse bias voltage 2708*a* limits uneven metal film deposition on the seed layer that may result during the immersion and/or removal of the substrate from the electrolyte solution. Alternatively, the voltage of the anode may be set equal to the voltage of the seed layer to limit both excessive deposition or etching of the metal film on the seed layer. If neither a plating voltage nor a deplating voltage is applied to the substrate seed layer, while little deposition to the seed layer occurs, little etching occurs. The duration from when the first portion of the seed layer is immersed to when the substrate is fully immersed is quite rapid, usually under three seconds, during which time a slight reverse bias is applied.

When the voltage of the seed layer is greater than the voltage of the anode, the ions in the electrolyte solution are not attracted to the seed layer in sufficient quantities to effect plating. However, certain embodiments of electrolyte solution has a low pH, i.e., acidic, as these embodiments contain a considerable amount of hydrochloric acid. Since such an electrolyte solution itself is acidic, it will slightly etch (deplate) the seed layer and/or the metal film metal if no voltage is applied between the anode and the substrate. Thus, it might also make sense to apply a very low plating voltage during substrate immersion.

The metal film deposition process is a function of the bias voltage applied between the anode and the seed layer on the substrate. As positively charged copper ions are deposited to form the metal film on the negatively charged substrate seed layer by the plating voltage, the copper ions from the depletion regions are depleted. However, an atom-level electronic exchange, associated with the chemical reaction of the anode in the electrolyte solution current, drives copper atoms contained in the anode into the electrolyte solution from the anode. Thus, the anode in many embodiments includes a solid piece of copper. The plating voltage portion 2714 can actually be a series of prescribed voltage levels with the voltage levels and the durations selected as a function of the composition of the electrolyte solution. The voltage levels and durations depend on such factors as the electrolyte solution being used, the distance between the anode and the seed layer, the dimension of the electrolyte cell and the substrate, and the desired metal film deposition thickness. Alternatively, the plating voltage portion 2714 can be arranged as a series of plating voltages alternating with a series of etching voltages. The etching voltages can be applied, e.g., to keep openings or "throats" of features formed in the substrate seed layer open so the features can be more completely filled during the plating voltages.

The chemical reaction embodiments that may occur in the embodiment of ECP system shown in FIGS. 1 or 6 may be characterized by whether a positive bias is applied between the anode and the seed layer to effect plating metal film on the substrate, or whether a negative bias is applied between the anode and the seed layer to effect deplating metal film on the substrate. If a sufficient positive bias is applied so the voltage of the seed layer is below the voltage of the anode to effect plating on the substrate the following exemplary chemical reactions occur:

The anode chemical reaction is:

$$2H_2O \rightarrow O_2 + 4H^+ + 4e^-$$

The cathode (seed layer) chemical reaction is:

$$Cu^{++} + 2e^- \rightarrow Cu$$

If a sufficient negative bias is applied so the voltage of the seed layer exceeds the voltage of the anode by a sufficient level to effect deplating copper from the seed layer, the following exemplary chemical reactions occur:

The anode chemical reaction is:

$$Cu \rightarrow Cu^{++} + 2e^-$$

The cathode (seed layer) chemical reaction is:

$$Cu^{++} + 2e^- \rightarrow Cu$$

The voltage of the electrolyte solution adjacent the substrate seed layer is relatively small, e.g., about 1 volt. The copper ions therefore arrive at the seed layer surface primarily by diffusion within the electrolyte solution. The voltage level of the seed layer controls the rate at which the copper ions deposit on the substrate seed layer to form a metal film. Higher voltages established between the anode and the substrate seed layer force more ions into the electrolyte solution as a result of increasing the chemical reaction between the anode and the seed layer. The higher voltage levels result in a higher deposition rate of metal ions onto the substrate seed layer since a higher concentration of copper is contained in the electrolyte solution due to the increased chemical reaction between the anode and the electrolyte solution.

Increasing the voltage level between the anode and the seed layer affects the deposition rate of the seed layer only up to the level of the diffusion limit, at which level all of the diffused ions are converted into copper ions. Above the diffusion limit, a further increase in the voltage between the anode and the seed layer breaks the bonds of the water in the electrolyte solution and does not improve the deposition rate of the metal film on the seed layer.

Figure 28A:
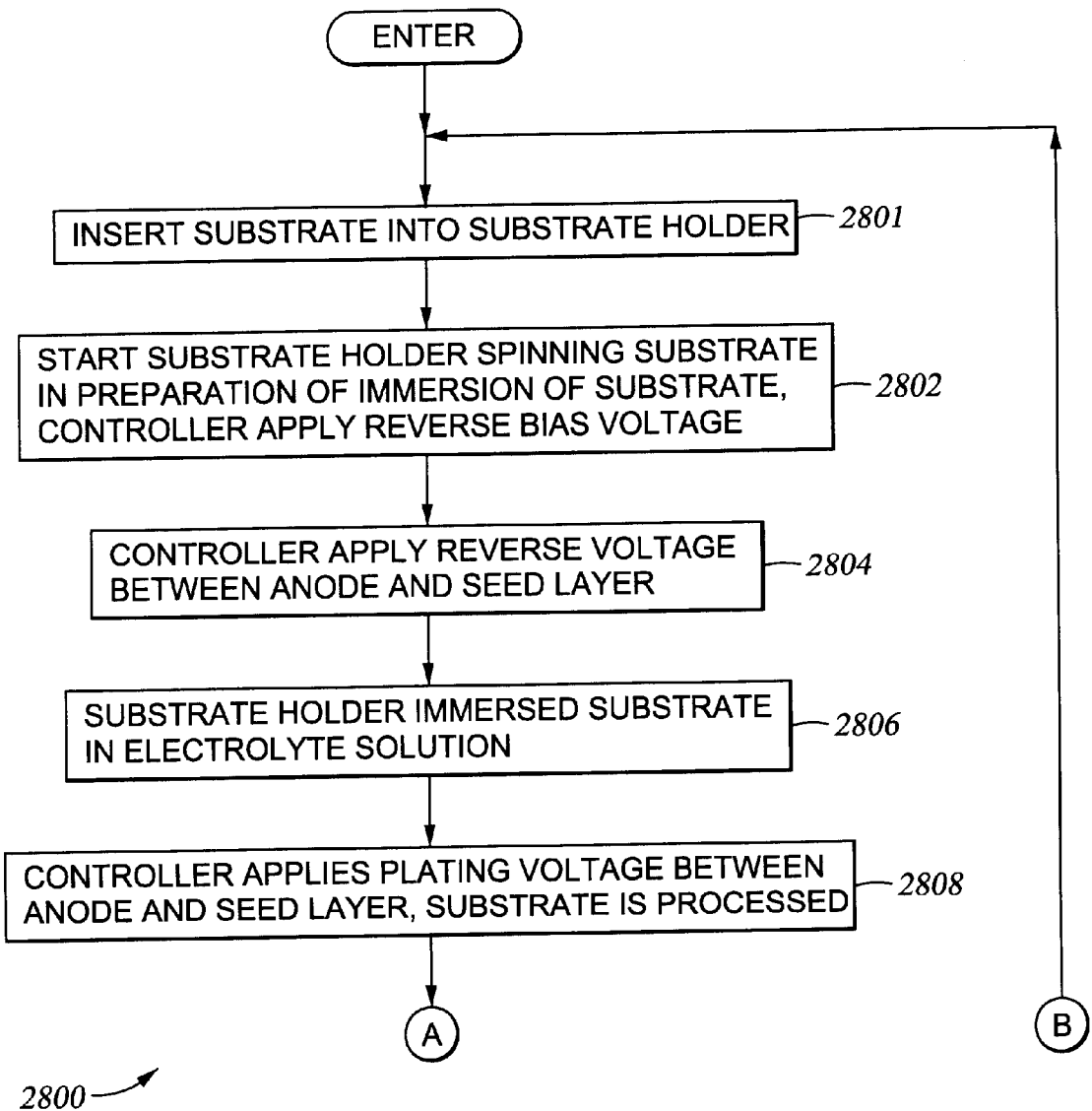
FIG. 28 shows one embodiment of a method including FIGS. 28A and 28B as indicated in FIG. 28 that is controlled by the controller of FIG. 3 during immersion of a substrate into electrolyte solution.
Figure 28B:
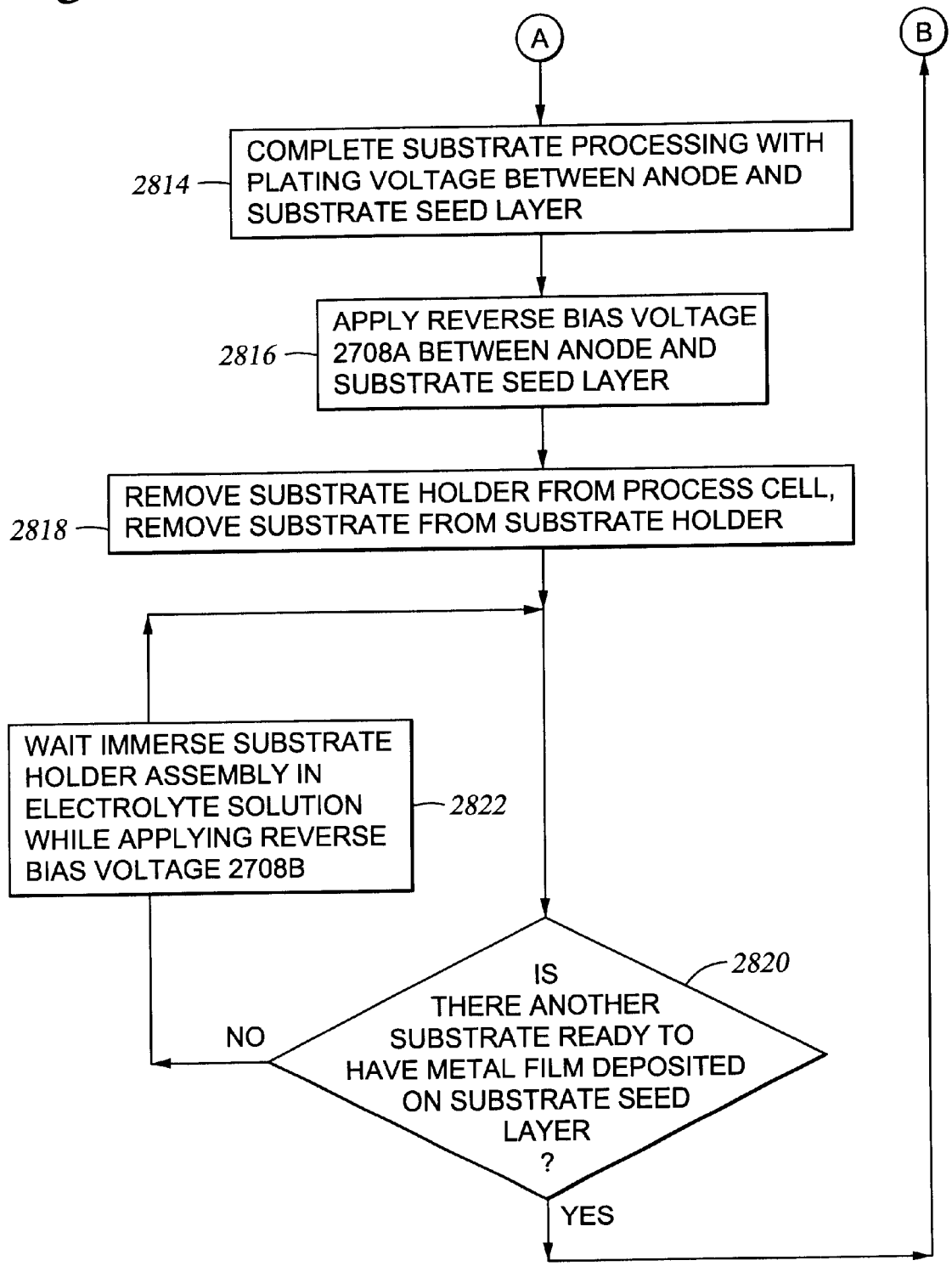

FIG. 28, including FIGS. 28A and 28B, shows one embodiment of method 2800 performed by the controller 222 that controls the electric current/voltage applied from the anode to the seed layer, in which a substrate is immersed into the electrolyte solution contained in the electrolyte cell during each voltage cycle 2720. Method 2800 includes a relatively brief reverse bias voltage portion 2708a being applied between the anode and the substrate seed layer. The method 2800 is discussed in relation with the voltage cycle shown in FIG. 27. Method 2800 starts with block 2802 in which the substrate holder assembly, that holds the substrate in a position such that the substrate is removed from the electrolyte solution contained within the electrolyte cell, starts spinning the substrate in at an angular velocity of less than about 100 RPM (commonly under 30 RPM) preparation of the substrate being immersed in the electrolyte solution. The spinning is performed only on those substrate holder systems that are configured to spin the substrate such as, e.g., the embodiment shown in FIG. 25. Certain substrate holder systems, such as shown in the embodiment of FIG. 1, are not configured to rotate the substrate. Such spinning occurs, in certain embodiments, within the neutral voltage period 2706. The period 2706 may be applied for a prescribed period after each plating voltage portion 2714 that is sufficient to remove the liquid from the surface of the substrate by centrifugal action.

Method 2800 continues to block 2804 in which the controller applies the reverse bias voltage portion, 2708a as shown in FIG. 27, between the anode and the seed layer. The voltage level of the seed layer equals, or is more positive than, the voltage level of the anode during the reverse bias voltage portion 2708a. As such, the seed layer is actually slightly anodic relative to the anode during the reverse bias voltage. The positive voltage level of the anode relative to the seed layer is of an insufficient voltage, and applied for an insufficient duration, to cause considerable etching of the seed layer and/or the metal film deposited on the seed layer. When the seed layer on the substrate does not contact the electrolyte solution in the electrolyte cell, an open circuit exists since no medium is carrying electric current between the anode and the seed layer. Any voltage differences between the anode and the seed layer does not result in an associated current flow as long as the substrate seed layer is removed from the electrolyte solution since no current path exists between the anode and the seed layer.

The method 2800 continues to block 2806 in which the substrate holder system immerses the substrate seed layer into the electrolyte solution. As soon as any portion of the seed layer is immersed in the electrolyte solution, a closed circuit is formed between the anode and those portions of the seed layer that are immersed. The immersion process is performed quickly in one embodiment to limit any undesired, or uneven etching that may occur on the substrate as the reverse bias voltage portion 2708a is applied between the anode and the seed layer. Such limiting of the deposition during immersion is desired since portions of the substrate may not be immersed early during the immersion process. For example, certain embodiments of substrate holder systems immerse the substrate in the electrolyte solution in a tilted position wherein the substrate is angled from horizontal. In these embodiments of substrate holder systems, peripheral parts of the tilted seed layer on the substrate are immersed before other seed layer parts. The reverse bias applied between the anode and the seed layer limits the plating that occurs on the seed layer during the immersion process. The method 2800 continues to block 2808 after full immersion, in which the plating voltage portion 2714 is applied between the anode and the seed layer. Since the seed layer is immersed in the electrolyte solution, a closed circuit is formed between the anode and the seed layer. The substrate seed layer is thereby cathodic relative to the anode. The deposition rate of metal film on the seed layer on the substrate is a function of the current density applied to the seed layer. The current density on the seed layer is a function of the current flow between the anode to the seed layer. The current from the anode to the seed layer, in turn, is a function of the voltage between the anode and the seed layer. Therefore, the controller 222 can control the deposition rate of a metal film on the seed layer by controlling the voltage level applied by a power supply between the anode and the seed layer. During block 2808, the seed layer on the substrate is processed, i.e., electroplated, at which time a metal film is deposited on the substrate.

The method 2800 continues to block 2814 in which the substrate held in the electrolyte cell by the substrate holder system 14 completes the metal film deposition using plating voltage between the anode and the seed layer, such as the plating voltage portion 2714 shown in FIG. 27. The method 2800 continues to block 2816 in which the controller applies reverse bias voltage 2708A between the anode and the seed layer. The duration of the reverse bias voltage in block 2816 is envisioned to be sufficient for a first substrate to be removed from the electrolyte solution, for a second substrate to be positioned within the substrate holder assembly, and for the second substrate to be immersed into the electrolyte solution. The method 2800 then continues to block 2818 in which the substrate is removed from the process cell. During the removal of the substrate from the process cell, the reverse bias voltage will be sufficient to limit excessive deposits forming on either the substrate seed layer, or the electric contact within the substrate holder assembly. The duration in which the substrate and the electric contacts are completely removed from the electrolyte solution within the process cell is relatively brief to limit the electrolyte solution drying on the face of the seed layer on the substrate or on the electric contacts. Such limiting of the electrolyte solution drying on the electric contacts also limits a crystalline coating containing copper sulfate from forming on the electric contacts that would alter the electric properties of the electric contacts.

The method 2800 then continues to decision block 2820 in which the controller determines if there is another substrate that is ready to be processed. If the answer to decision block 2820 is no, then the method 2800 continues to block 2822. In block 2822, the controller 222 performs a loop with decision block 2910, in which controller waits and applies the reverse bias voltage 2708b until the next substrate is ready to be inserted within the substrate holder assembly into the electrolyte solution. As the reverse bias voltage 2708b is applied, the substrate holder system holds the electric contacts in an immersed position in the electrolyte solution. Immersing the electric contacts into the electrolyte solution during down time limits the exposure of the electric contacts to air, and thereby limits the oxidation of the electric contacts. Additionally, immersing the electric contacts into the electrolyte solution during down time limits the evaporation of the electrolyte solution onto the surface of the electric contacts. The evaporation of the water in the electrolyte solution on the electric contacts would result in the coating of the electric contacts with the copper sulfate in the electrolyte solution. During the immersion of the electric contacts into the electrolyte solution, the application of the reverse bias voltage 2708b is also sufficient to limit the deposition of copper from the electrolyte solution onto the electric contacts.

If the answer to decision block 2820 is yes, then the method 2800 loops back to block 2801. Method 2800 loops continuously to perform the waveform described relative to FIG. 27 on successive substrates. The user can input information to the controller 222 if it is desired to discontinue the method 2800 at any point.

While the foregoing is directed to the preferred embodiment of the present invention, other and further embodiments of the invention may be devised without departing from the basic scope thereof.

What is claimed is:

1. A method of immersing a substrate into an electrolyte solution for electroplating, the method comprising:
   connecting an electric source between an anode immersed in the electrolyte solution and a seed layer formed on the substrate;
   immersing the substrate into the electrolyte solution; and
   biasing the seed layer with a positive voltage relative to the anode as the substrate is being immersed into the electrolyte solution.

2. The method of claim 1, further comprising rotating the substrate as the substrate is immersed into the electrolyte solution.

3. A method of immersing a substrate into an electrolyte solution for electroplating, the method comprising:
   connecting an electric source between an anode immersed in the electrolyte solution and a seed layer formed on the substrate;
   biasing a first voltage level of the seed layer to be equal to or more positive than a second voltage level of the anode, wherein the first voltage level is applied to the seed layer and the second voltage level is applied to the seed layer after the substrate is immersed in the electrolyte solution; and
   immersing the substrate into the electrolyte solution.

4. The method of claim 1, wherein the positive voltage is configured to limit the deposition of a metal film on the seed layer.

5. The method of claim 1, wherein the biasing step comprises biasing the seed layer with the positive voltage for less than about 30 seconds.

6. A computer readable medium containing a program that, when executed, performs an operation comprising:
   connecting an electric source between an anode immersed in the electrolyte solution and a seed layer formed on the substrate;
   immersing the substrate into the electrolyte solution; and
   biasing the seed layer with a positive voltage relative to the anode as the substrate is being immersed into the electrolyte solution.

7. A method of electroplating a substrate, comprising:
   connecting an electric source between an anode immersed in an electrolyte solution and a seed layer formed on the substrate;
   biasing the electric source to a reverse voltage bias in which a first voltage level of the seed layer equals or is more positive than a second voltage level of the anode;
   immersing the substrate into the electrolyte solution; and
   biasing the electric source to a plating voltage bias in which the voltage level of the anode equals or exceeds the voltage level of the seed layer.

8. The method of claim 7, further comprising:
   biasing the electric source to a second reverse voltage bias in which a third voltage level of the seed layer equals or is more positive than a fourth voltage level of the anode; and
   removing the seed layer from the electrolyte solution.

9. The method of claim 7, further comprising rotating the substrate as the substrate is immersed into the electrolyte solution.

10. The method of claim 7, further comprising selectively controlling biasing the voltage of the electric source.

11. A computer readable medium containing a program that, when executed, performs an operation comprising:
    connecting an electric source between an anode immersed in the electrolyte solution and a seed layer formed on the substrate;
    applying a first reverse bias voltage in which a voltage level of the seed layer is equal to or more positive than a voltage level of the anode;
    immersing the substrate into the electrolyte solution; and
    applying a plating voltage in which the voltage level of the anode exceeds the voltage level of the seed layer.

12. The computer readable medium of claim 11, wherein the operation further comprises:
    applying a second reverse bias voltage in which the voltage level of the seed layer is equal to or more positive than the voltage level of the anode; and
    removing the substrate from the electrolyte solution.

13. The computer readable medium of claim 11, wherein the operation further comprises rotating the substrate as the substrate is being immersed into the electrolyte solution.

14. A method of removing a substrate from electrolyte solution, comprising:
    connecting an electric source between an anode immersed in the electrolyte solution and a seed layer formed on the substrate;
    biasing a first voltage level of the seed layer to be equal or more positive than a second voltage level of the anode;
    immersing the substrate into the electrolyte solution;
    biasing a third voltage level of the seed layer to be more negative than a fourth voltage level of the anode;
    biasing a fifth voltage level of the seed layer to equals or more positive than a sixth voltage level of the anode; and
    removing the substrate from the electrolyte solution.

15. The method of claim 14, wherein the voltage level of the anode equals or exceeds the voltage level of the seed layer after the substrate is immersed in the electrolyte solution but before the substrate is removed from the electrolyte solution to enhance the electric current density applied to the seed layer.

16. The method of claim 14, wherein after the changing the biasing after the substrate is immersed in the electrolyte solution, the voltage level of the seed layer equals or exceeds the voltage level of the anode by an amount sufficient to limit the deposition of a metal film on the seed layer.

17. The method of claim 14, wherein after the changing the biasing after the substrate is immersed in the electrolyte solution, the voltage level of the seed layer equals or exceeds the voltage level of the anode by an amount sufficient to limit the variation of the electric current density applied across the seed layer.

18. An electroplating system for plating a substrate, comprising:
   an electric source configured to be connected between an anode immersed in an electrolyte solution and a seed layer formed on the substrate;
   a controller configured to control electric biasing of the electric source to a reverse voltage bias in which a first voltage level of the seed layer equals or is more positive than a second voltage level of the anode; and
   a substrate holder system configured to immerse the substrate into the electrolyte solution, wherein following immersion, the controller is configured to bias the electric source to a plating voltage bias in which the voltage level of the anode equals or exceeds the voltage level of the seed layer.

19. The electroplating system of claim 18, wherein following immersion, the controller is configured to control the electric source to apply a second reverse bias voltage in which the voltage level of the seed layer is equal to or is more positive than the voltage level of the anode.

20. The electroplating system of claim 19, wherein the substrate holder system is configured to remove the substrate from the electrolyte solution following the application of the second reverse bias voltage.

21. The electroplating system of claim 18, wherein the substrate holder system is configured to rotate the substrate as the substrate is immersed into the electrolyte solution.

22. A method of electroplating a substrate, comprising:
   applying a reverse bias voltage between one or more electric contacts and an anode immersed in an electrolyte solution containing metal ions as the substrate is being immersed into the electrolyte solution, the electric contacts being configured to provide electrical bias to a seed layer formed on the substrate; and
   applying a plating voltage to the contacts following immersion.

23. The method of claim 22, wherein a polarity of the reverse bias voltage is opposite of a polarity of the plating voltage.

24. The method of claim 22, wherein the reverse bias voltage represents a positive voltage relative to the anode and the plating voltage represents a negative voltage relative to the anode.

25. The method of claim 22, wherein the reverse bias voltage is configured to limit the metal ions from depositing on the electric contacts while the substrate is being immersed into the electrolyte solution.

26. The method of claim 22, further comprising applying the reverse bias voltage between the contacts and the anode as the substrate is removed from the electrolyte solution.

27. The method of claim 22, wherein applying the reverse bias voltage comprises applying the reverse bias voltage for less than about 30 seconds.

28. A method of electroplating a substrate, comprising:
   connecting an electric source between an anode immersed in an electrolyte solution and a seed layer formed on the substrate;
   applying a first reverse bias voltage in which a voltage level of the seed layer is equal to or more positive than a voltage level of the anode;
   immersing the substrate into the electrolyte solution; and
   applying a plating voltage in which the voltage level of the anode exceeds the voltage level of the seed layer.

29. The method of claim 28, further comprising:
   applying a second reverse bias voltage in which the voltage level of the seed layer is equal to or more positive than the voltage level of the anode; and
   removing the substrate from the electrolyte solution.

30. An electroplating system for plating a substrate, comprising:
   an electric source configured to be connected between an anode immersed in an electrolyte solution and a seed layer formed on the substrate;
   a controller configured to control the electric source to apply a reverse bias voltage in which a voltage level of the seed layer is equal to or more positive than a voltage level of the anode; and
   a substrate holder system configured to immerse the substrate into the electrolyte solution, wherein following immersion, the electric source is configured to apply a plating voltage in which the voltage level of the anode exceeds the voltage level of the seed layer.

* * * * *